United States Patent
Ha

(10) Patent No.: US 10,885,976 B2
(45) Date of Patent: Jan. 5, 2021

(54) SEMICONDUCTOR MEMORY DEVICE INCLUDING PHASE CHANGE MEMORY DEVICE AND METHOD OF ACCESSING PHASE CHANGE MEMORY DEVICE

(71) Applicant: Samsung Electronics Co., Ltd., Suwon-si (KR)

(72) Inventor: Jin-Yong Ha, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/415,244

(22) Filed: May 17, 2019

(65) Prior Publication Data

US 2020/0066342 A1 Feb. 27, 2020

(30) Foreign Application Priority Data

Aug. 22, 2018 (KR) .................. 10-2018-0098075

(51) Int. Cl.
*G11C 11/00* (2006.01)
*G11C 13/00* (2006.01)
(Continued)

(52) U.S. Cl.
CPC ...... *G11C 13/0033* (2013.01); *G06F 11/1068* (2013.01); *G11C 13/003* (2013.01); *G11C 13/004* (2013.01); *G11C 13/0004* (2013.01); *G11C 13/0069* (2013.01); *G11C 29/52* (2013.01); *G11C 2213/72* (2013.01); *G11C 2213/79* (2013.01)

(58) Field of Classification Search
CPC .......... G11C 13/0033; G11C 13/0004; G11C 13/003; G11C 13/004; G11C 13/0069; G11C 29/52; G11C 2213/72; G11C 2213/79; G06F 11/1068
USPC .................................. 365/163, 148
See application file for complete search history.

(56) References Cited

U.S. PATENT DOCUMENTS 7,770,079 B2 8/2010 Radke et al.
7,808,831 B2 10/2010 Mokhlesi et al.
(Continued)

*Primary Examiner* — Huan Hoang
(74) *Attorney, Agent, or Firm* — Muir Patent Law, PLLC

(57) ABSTRACT

Nonvolatile memory devices, such as phase change memory (PCM) devices or other resistance based memory devices, are disclosed as well as methods of operating the same. Resistance states of the memory cells may be altered due to write disturbance resulting from write operations to neighboring word lines. Data reliability may be increased by performing check read operations of neighboring memory cells in response to a write operation. In some examples, a number of consecutive write operations performed on a memory cell array or a portion thereof is monitored. When the number of consecutive write operations reaches a predetermined number, which may be a randomly generated number in some examples, a corresponding check read operation may be performed. If the check read operation indicates certain sections of the memory have been subject to a write disturbance, data in such sections may be refreshed to provide adjust resistance states of corresponding memory cells. Monitoring for write disturbance and performing corresponding refresh operations may be performed by the nonvolatile memory semiconductor chip and/or by external devices, such as a controller.

24 Claims, 15 Drawing Sheets

(51) Int. Cl.
*G06F 11/10* (2006.01)
*G11C 29/52* (2006.01)

(56) References Cited

U.S. PATENT DOCUMENTS

| | | |
|---|---|---|
| 8,599,610 B2 | 12/2013 | Nawata |
| 9,147,501 B2 | 9/2015 | Hung et al. |
| 9,230,689 B2 | 1/2016 | Tuers |
| 9,361,997 B2 | 6/2016 | Lee |
| 9,502,128 B2 | 11/2016 | Lee |
| 9,613,687 B2 | 4/2017 | Kim et al. |
| 9,720,624 B2 | 8/2017 | Moon et al. |
| 2012/0239861 A1* | 9/2012 | Lee .................... G11C 11/5628 711/103 |
| 2013/0033929 A1 | 2/2013 | Kim |

\* cited by examiner

SEMICONDUCTOR MEMORY DEVICE INCLUDING PHASE CHANGE MEMORY DEVICE AND METHOD OF ACCESSING PHASE CHANGE MEMORY DEVICE

CROSS-REFERENCE TO RELATED APPLICATIONS

This application claims priority under 35 U.S.C. § 119 to Korean Patent Application No. 10-2018-0098075 filed on Aug. 22, 2018, in the Korean Intellectual Property Office, the disclosure of which is incorporated by reference herein in its entirety.

BACKGROUND

The inventive concept relates to a semiconductor device, and more particularly, relates to a semiconductor memory device, such as a phase change memory device, that checks for disturbances of programmed data and a method of accessing the phase change memory device.

Semiconductor memories include nonvolatile memories, such as phase change memories, ferroelectric memories, magnetic memories, resistive memories, and flash memories (e.g., NAND flash memories). Some nonvolatile memories, phase like change memories, are configured to change resistance values of its memory cells through a heating process. When a phase change memory performs a set operation or a reset operation on its phase change memory cells, heat is generated at the corresponding phase change memory cells.

The heat generated at the phase change memory cells may have an undesired influence other phase change memory cells adjacent to those being programmed. For example, if too much heat is transferred to phase change memory cells adjacent to the memory cells selected for programming, an undesired set operation or reset operation may occur, and resistance values of such adjacent phase change memory cells may be changed (i.e., disturbed). Repetitive read operations of one or more rows of memory cells may also result in undesired disturbance of neighboring rows of memory cells.

SUMMARY

Embodiments of the inventive concept provide a semiconductor memory device, such as a memory module, a controller and/or a phase change memory device, having improved reliability by checking a disturbance of adjacent or neighbor memory cells, a method of accessing the phase change memory device and systems implementing the same.

In some examples, a semiconductor memory device comprises a memory cell array comprising a plurality of memory cells arranged in a plurality of rows of memory cells, each memory cell comprising a variable resistor including a material having a changeable resistance; a plurality of word lines, each word line connected to a corresponding row of memory cells; a control logic circuit configured to write data to the memory cell array and read data from the memory cell array; and a checker circuit being configured, in response to a write operation to a first row of memory cells, to cause a check read operation of a second row of memory cells immediately adjacent to the first row of memory cells to determine if a programmed state of the second row of memory cells is indicative of a write disturbance to the programmed state of the second row of memory cells.

In some examples, the memory device may be a memory module and comprise a printed circuit board; a plurality of nonvolatile memory semiconductor chips, including a first nonvolatile memory semiconductor chip, connected to the printed circuit board, each of the nonvolatile memory semiconductor chips including a memory cell array of nonvolatile memory cells each comprising a variable resistor including a material having a changeable resistance, the nonvolatile memory cells being arranged in a plurality of rows of memory cells and a control logic circuit configured to write data to the memory cell array by altering resistances of memory cells of selected rows of memory cells, configured to read data from the memory cell array by comparing resistances of the memory cells of selected rows of memory cells to a reference resistance value; and a controller connected to the printed circuit board and connected to the plurality of nonvolatile memory semiconductor chips through one or more busses of the printed circuit board, the controller comprising a checker circuit.

The checker circuit may be configured to perform a random interval neighbor check (RINC) including, in response to a first write operation to a first row of memory cells of the first nonvolatile memory chip, performing a check read operation of a second row of memory cells of the first nonvolatile memory chip that is immediately adjacent to the first row of memory cells to determine if a programmed state of the second row of memory cells is indicative of a write disturbance to the programmed state of the second row of memory cells.

The checker circuit may be configured to perform a refresh operation on the second row of memory cells in response to determining that the programmed state of the second row of memory cells is indicative of write disturbance.

Disclosed embodiments include nonvolatile semiconductor chips. For example, a phase change memory (PCM) semiconductor chip comprising a memory cell array comprising a plurality of memory cells arranged in a plurality of rows of memory cells, each memory cell comprising a phase change material having a variable resistance; a plurality of word lines, each word line connected to a corresponding row of memory cells; a control logic circuit configured to write data to the memory cell array and read data from the memory cell array; and a checker circuit being configured, in response to a write operation to a first row of memory cells, to cause a check read operation of a second row of memory cells immediately adjacent to the first row of memory cells to determine if a programmed state of the second row of memory cells is indicative of a write disturbance to the programmed state of the second row of memory cells.

Methods of operating a memory device are also disclosed. According to one embodiment, a method comprises counting a number of consecutive write operations performed on a memory cell array or a portion of the memory cell array, the memory cell array comprising a plurality of memory cells arranged in a plurality of rows of memory cells, each memory cell comprising a variable resistor including a material having a changeable resistance; causing a first write operation to a first row of memory cells, wherein in response to the first write operation, the counting of the number of consecutive write operations provides a counted number of consecutive write operations that is equal to or greater than a first value stored in a first register; determining that the counted number of consecutive write operations is greater than or equal to the first value stored in the first register; in response to determining that the counted number of consecutive write operations is greater than or equal to the first number, causing a check read operation of a second row of memory cells immediately adjacent to the first row of memory cells; and based on the check read operation of the second row of memory cells, determining if a programmed state of the second row of memory cells is indicative of a write disturbance to the programmed state of the second row of memory cells. The methods and associated operations described herein may be performed by nonvolatile memory (such as nonvolatile memory formed as in integrated circuit in a semiconductor chip or in semiconductor package), a controller, a memory module, solid state storage and systems employing the same.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Exemplary embodiments of the invention are described in detail below. However, the invention may be embodied in many different forms and should not be construed as limited to the various details of the exemplary embodiments set forth herein. These example embodiments are just that—examples—and many different embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Figure 1:
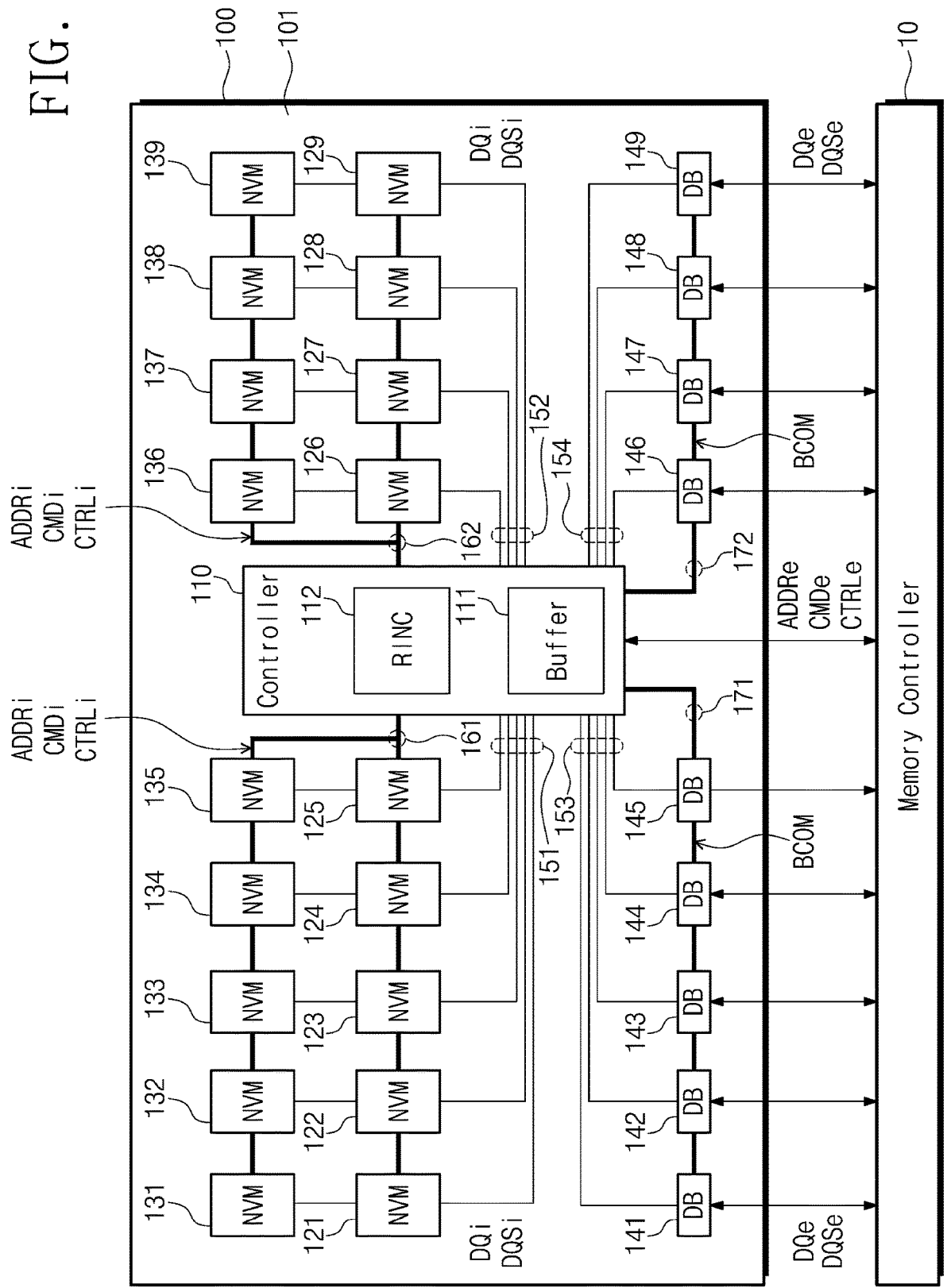
FIG. 1 is a block diagram illustrating a memory module according to an embodiment of the inventive concept.

FIG. 1 is a block diagram illustrating a memory device according to an embodiment of the inventive concept. The memory device of FIG. 1 comprises a memory module 100 and, in certain implementations, may be used as a main memory, such as a main random access memory of a computer or server. In some examples, memory module 100 may be or form part of a solid state drive of a computer and/or server (e.g., forming cloud data storage drive). The memory module 100 may be easily removable from the system in which it is implemented, such as through a physical connector that plugs into a corresponding slot (e.g., mates with an electrical connector) of the system. In some examples, the memory module 100 may be provided in the form of a memory card including a plurality of nonvolatile memory devices (e.g., memory chips) such as described herein mounted on a printed circuit board 101 and protected within a resin encapsulating molding (not shown).

Referring to FIG. 1, the memory module 100 includes a controller 110, first nonvolatile memory devices 121 to 129, second nonvolatile memory devices 131 to 139, and data buffers 141 to 149. The controller 110, the first nonvolatile memory devices 121 to 129, the second nonvolatile memory devices 131 to 139, and the data buffers 141 to 149 may each be embodied by one or more semiconductor chips and may each be implemented with different semiconductor packages, and such semiconductor packages may be mounted on printed circuit board 101. The printed circuit board 101 may provide (via lines of the printed circuit board 101) signal and power connections between the various semiconductor chips mounted thereon as well as between the semiconductor chips of the memory module 100 and sources external to the memory module 100 (such as memory controller 10).

Each of the first nonvolatile memory devices 121 to 129 and the second nonvolatile memory devices 131 to 139 may include one or more nonvolatile memory semiconductor chips, such as flash memory (e.g. NAND flash) memory chip(s), phase change memory (PCM or PRAM) memory chip(s), magnetoresistive random access memory (MRAM) memory chip(s), ferroelectric random-access memory (FRAM) memory chip(s), and/or resistive random-access memory (ReRAM) memory chip(s). Resistance based memories, such as PCM, MRAM, ReRAM, etc., may program its memory cells to alter a resistance each memory cell (to represent one or more data bits that may be stored in a memory cell), which may later be detected to determine the resistance state of the memory cell and thus extract its data.

The controller 110 may receive an external address ADDRe, an external command CMDe, and an external control signal CTRLe from memory controller 10 external to the controller 110. The external address ADDRe may be received in the form of a set of address signals, and the external command CMDe may be received in the form of a set of command signals.

The controller 110 may be connected to the first nonvolatile memory devices 121 to 129 and the second nonvolatile memory devices 131 to 139 through first data bus lines 151 and 152. The first nonvolatile memory devices 121 to 129 may correspond to the second nonvolatile memory devices 131 to 139, respectively. For example, one (e.g., 121) of the first nonvolatile memory devices 121 to 129 and the corresponding one (e.g., 131) of the second nonvolatile memory devices 131 to 139 may be connected in common to one or more shared data bus lines of the first data bus lines 151 and 152, that is, to the same subset of data bus lines. The shared common connection of a subset of the nonvolatile memory devices 121 to 129 and 131 to 139 may be exclusive to those nonvolatile memory devices and not shared by the other nonvolatile memory devices 121 to 129 and 131 to 139 (e.g., the shared data bus lines connecting first nonvolatile memory device 121 and second nonvolatile memory device 131 to controller 110 may be exclusive to first and second nonvolatile memory devices 121, 131—not shared by first and second nonvolatile memory devices 122 to 129 and 132 to 139).

Each of the first data bus lines 151 and 152 may include two or more data lines (e.g., 8) transferring internal data signals DQi and one or more data strobe lines (e.g., 2) transferring internal data strobe signals DQSi. Such data lines and data strobe lines may connect to data buffers of the nonvolatile memory devices 121 to 129 and 131 to 139 and controller 110 to which they are connected, such data buffers including latches may be configured to latch transferred internal data signals DQi at a timing provided by the transferred internal data strobe signal(s) DQSi.

The controller 110 may be connected to the first nonvolatile memory devices 121 to 129 and the second nonvolatile memory devices 131 to 139 through first control lines 161 and 162. The first control lines 161 and 162 may be connected in common to the first nonvolatile memory devices 121 to 129 and the second nonvolatile memory devices 131 to 139.

The controller 110 may generate an internal address ADDRi from the external address ADDRe, may generate an internal command CMDi from the external command CMDe, and may generate an internal control signal CTRLi from the external control signal CTRLe. The controller 110 may control the first nonvolatile memory devices 121 to 129 and the second nonvolatile memory devices 131 to 139 by transferring the internal address ADDRi, the internal command CMDi, and the internal control signal CTRLi through the first control lines 161 and 162 (e.g., as corresponding electrical signals on the first control lines 161 and 162).

The controller 110 may be connected to the data buffers 141 to 149 through second data bus lines 153 and 154. The second data bus lines 153 and 154 may include a plurality of data lines and one or several data strobe lines to transfer data signals as described with respect to the first data bus lines 151 and 152. The controller 110 may control the data buffers 141 to 149 through second control lines 171 and 172. The controller 110 may control the data buffers 141 to 149 by transferring a buffer command BCOM to the data buffers 141 to 149 through the second control lines 171 and 172 depending on the external command CMDe and the external control signal CTRLe. Data buffers 141 to 149 may be embodied as semiconductor chips.

The controller 110 may perform mutual conversion between the internal data signals DQi and external data signals DQe. The controller 110 may include a buffer 111 for buffering (e.g., temporarily storing information) between the signals ADDRe, CMDe, CTRLe, and DQe communicated with the memory controller 10 and the signals ADDRi, CMDi, CTRLi, and DQi communicated with the first nonvolatile memory devices 121 to 129 and the second nonvolatile memory devices 131 to 139.

The controller 110 may include a checker 112 (which may also be referred to herein as a checker circuit) configured to perform a check read operation on the first nonvolatile memory devices 121 to 129 and the second nonvolatile memory devices 131 to 139 and to supplement the integrity of data depending on a result of the check read operation.

For example, the checker 112 may perform a random interval neighbor check RINC. The random interval neighbor check RINC may include an operation of checking the integrity of data stored in memory cells neighboring memory cells that were selected to be accessed. Exemplary details of the random interval neighbor check RINC operations of the checker 112 will be more fully described later.

In this example, the memory controller 10 is connected to transfer the external address ADDRe, the external command CMDe, and the external control signal CTRLe directly to the controller 110 without use of additional buffers interposed therebetween (although such additional buffers may be used in alternative implementations). In this example, the memory controller 10 is connected to transfer the external data signals DQe and external data strobe signals DQSe to the controller 110 through the data buffers 141 to 149 (although such data buffers 141 to 149 need not be provided in other implementations). The memory controller 10 may act as a host of the memory module 100 and control access operations of the memory module 100 (e.g., read and write operations).

The memory controller 10 may identify the first nonvolatile memory devices 121 to 129 as one rank (e.g., a first rank), and may identify the second nonvolatile memory devices 131 to 139 as another rank (e.g., a second rank). The memory controller 10 may provide commands to the controller 110 to request the controller 110 to access nonvolatile memory devices belonging to one rank at the same time. The controller 110 may support a rank-based access depending on a request of the memory controller 10.

For example, when the memory controller 10 requests (e.g., via a single command) a write operation or a read operation with regard to the first rank, the controller 110 may perform the write operation or the read operation on all nonvolatile memory devices of the first rank (in this example, the first nonvolatile memory devices 121 to 129). When the memory controller 10 requests (e.g., via a single command) a write operation or a read operation with regard to the second rank, the controller 110 may perform the write operation or the read operation on all nonvolatile memory devices of the second rank (in this example, the first nonvolatile memory devices 131 to 139). Such rank-based accesses may be performed on a plurality (all or a subset) of the nonvolatile memory devices of the corresponding rank at the same time (such access operation of the nonvolatile memory devices of the same rank may overlap in time in a staggered manner or be initiated at the same time, depending on design considerations).

The controller 110 may transfer the external data signals DQe provided for a write operation from the memory controller 10 to the first rank or the second rank as the internal data signals DQi. The controller 110 may transfer the internal data signals DQi read from the first rank or the second rank through the read operation to the memory controller 10 as the external data signals DQe.

Figure 2:
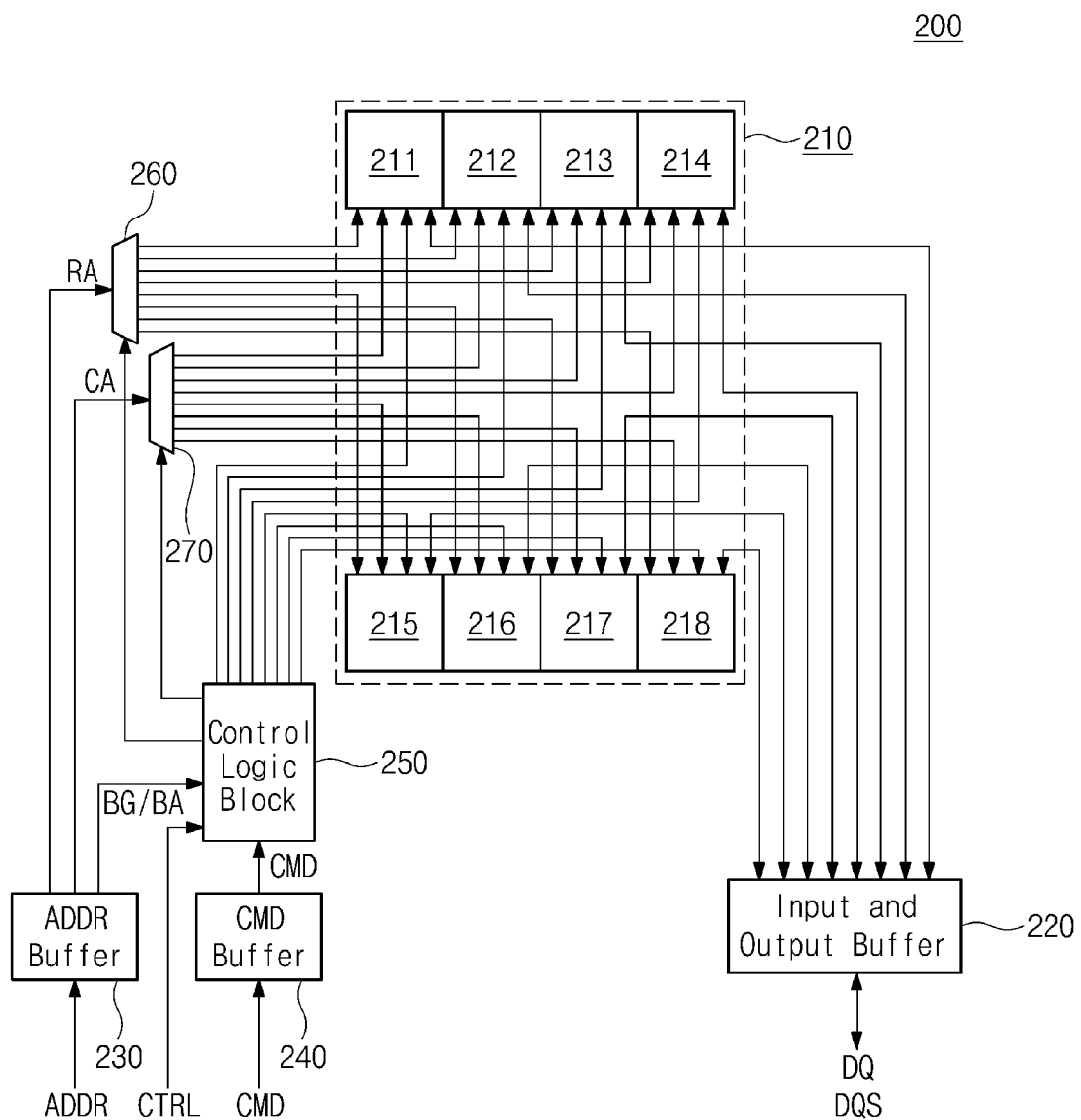
FIG. 2 is a block diagram illustrating an exemplary nonvolatile memory device.

FIG. 2 is a block diagram illustrating a nonvolatile memory device 200 according to an embodiment of the inventive concept. Each of the first and second nonvolatile memory devices 121 to 129 and 131 to 139 may be implemented as one or several nonvolatile memory devices 200 described herein, however, other nonvolatile memory devices may also be used. In an exemplary embodiment, the nonvolatile memory device 200 may be phase change memory semiconductor integrated circuit chips. However, the nonvolatile memory device 200 is not limited to phase change memory and other may constitute other types of nonvolatile memory (e.g., NAND flash memory). The nonvolatile memory device 200 in this example includes a bank array 210, an input and output buffer 220, an address buffer 230, a command buffer 240, a control logic block 250, a first demultiplexer 260, and a second demultiplexer 270.

The bank array 210 comprises first to eighth banks 211 to 218. The first to eighth banks 211 to 218 each include memory cells for storing data. The first to eighth banks 211 to 218 may read and write operations independently of each other and such read and write operations may be performed concurrently by some or all of the banks. The example illustrated shows the bank array 210 formed of eight banks, but the number of banks is not limited to eight.

The input and output buffer 220 may exchange data signals DQ a selected one of the first to eighth banks 211 to 218. Also, the input and output buffer 220 may exchange the data signals DQ and the data strobe signals DQS with an external device (e.g., the controller 110).

As part of a read operation, the input and output buffer 220 may transfer the data signals DQ provided from the selected bank to an external device in synchronization with the data strobe signals DQS (that are generated and transmitted from the input and output buffer 220 when transferring the data signals DQ to the external device). During a write operation, the input and output buffer 220 may latch the data signals DQ provided from the external device in synchronization with data strobe signals DQS transmitted from the external device and transfer the latched data signals DQ to the selected bank. Operations and timing of such operations of the input and output buffer 220 may be under control of the control logic block 250 (control signal lines between the control logic block 250 and the input and output buffer 220 not shown).

The nonvolatile memory device 200 may be used for each of the first and second nonvolatile memory devices 121 to 129 and 131 to 139 of the memory module 100 described herein. In addition, the nonvolatile memory device 200 may be used in other memory systems, such as a memory system in which one or more nonvolatile memory devices 200 are directly accessed by the memory controller 10 described herein. It will thus be understood that the data signals DQ and the data strobe signals DQS shown in FIG. 2 that are exchanged with the external device (the device that is external to the nonvolatile memory device 200) and the input and output buffer 220 may constitute the internal data signals DQi and the internal data strobe signals DQSi described with respect to the embodiment of FIG. 1 (when the first and second nonvolatile memory devices 121 to 129 and 131 to 139 are implemented with a corresponding nonvolatile memory device 200 of FIG. 2) or the external data signals DQe and the external data strobe signals DQSe described with respect to FIG. 1 (when the nonvolatile memory device 200 is implemented in a memory system that provides direct access between one or more nonvolatile memory devices 200 and memory controller 10). FIG. 2 and the corresponding description generically represents both of these exemplary implementations as exchanging the data signals DQ and the data strobe signals DQS with the external device.

The address buffer 230 may receive an address ADDR from the external device. The address ADDR may include a row address RA, a column address CA and a bank address BA and/or bank group address BG. The address buffer 230 may transfer bank information BG/BA of the received address ADDR to the control logic block 250. The bank information BG/BA may be a bank address (uniquely identifying one of the banks 211 to 218), a bank group address (identifying a subgroup of the banks 211 to 218), or a bank address and a bank group address.

The address buffer 230 may transfer a row address RA of the received address ADDR to the first demultiplexer 260. The address buffer 230 may transfer a column address CA of the received address ADDR to the second demultiplexer 270. The address buffer 230 may operate at appropriate timing under control of the control logic block 250.

The command buffer 240 may receive a command CMD from the external device. The command buffer 240 may transfer the received command CMD to the control logic block 250. The command buffer 240 may operate at appropriate timing under control of the control logic block 250.

The control logic block 250 may receive the bank information BG/BA from the address buffer 230. The control logic block 250 may receive the command CMD from the command buffer 240. The control logic block 250 may receive a control signal CTRL from the external device. The control logic block 250 may perform an operation in response to the bank information BG/BA, the command CMD, and the control signal CTRL.

For example, the control logic block 250 may control timings at which the input and output buffer 220, the address buffer 230, and the command buffer 240 operate. The control logic block 250 may control the first demultiplexer 260 and the second demultiplexer 270 to selectively transfer the received row address RA and column address CA to one or more banks as identified by the bank information BA/BG. The control logic block 250 may control operations of the first to eighth banks 211 to 218, such as a write operation or a read operation, in response to the received command CMD.

As noted, each of the first and second nonvolatile memory devices 121 to 129 and 131 to 139 of the memory module 100 may be implemented with one or more nonvolatile memory device(s) 200. In such an exemplary embodiment, the address buffer 230, the command buffer 240, and the control logic block 250 may exchange the internal address ADDRi, the internal command CMDi, and internal control signals CTRLi shown in FIG. 1 with the external device (constituting controller 110 in this instance). As noted, other embodiments contemplate memory systems in which a nonvolatile memory device 200 may be directly accessed by the memory controller 10 described herein. In such exemplary embodiments, the nonvolatile memory device 200 may exchange the external address ADDRe, the external command CMDe, and external control signals CTRLe with the external device (constituting memory controller 10 in this example). FIG. 2 and the corresponding description generically represents both of these exemplary implementations as exchanging the address ADDR, the command CMD, and the control signals CTRL with the external device.

The first demultiplexer 260 may receive the row address RA from the address buffer 230. Under control of the control logic block 250, the first demultiplexer 260 may transfer the row address RA to one of the first to eighth banks 211 to 218 that is selected by the bank information BG/BA received with the command CMD.

The second demultiplexer 270 may receive the column address CA from the address buffer 230. Under control of the control logic block 250, the second demultiplexer 270 may transfer the column address CA to one of the first to eighth banks 211 to 218 that is selected by the bank information BG/BA received with the command CMD.

Figure 3:
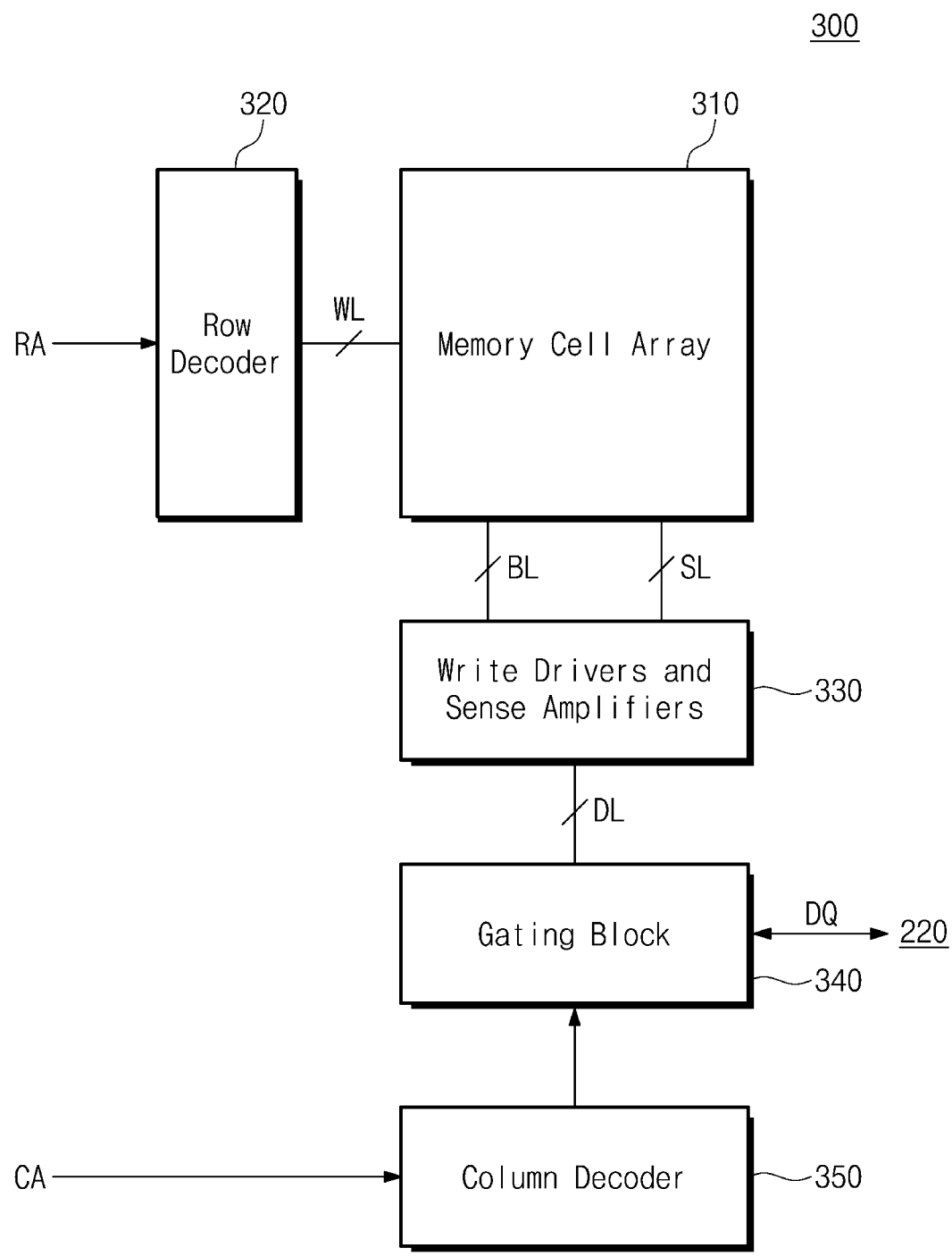
FIG. 3 is a block diagram illustrating an exemplary bank.

FIG. 3 is a block diagram illustrating a bank 300 according to an embodiment of the inventive concept. The bank 300 may be one of the first to eighth banks 211 to 218 illustrated in FIG. 2. The bank 300 may include a memory cell array 310, a row decoder 320, write drivers and sense amplifiers 330, a gating block 340, and a column decoder 350.

The memory cell array 310 comprises memory cells connected to word lines WL, bit lines BL, and source lines SL. For example, the memory cell array 310 may comprise memory cells arranged in rows and columns, with each row of memory cells connected to a corresponding word line WL. Memory cells in each column may be connected to a corresponding bit line BL and a corresponding source line SL. The memory cells of the memory cell array 310 may be phase change memory cells.

The row decoder 320 is connected to the word lines WL and to the memory cell array 310 through the word lines WL. Upon the row decoder 320 receiving a row address RA (e.g., from the first demultiplexer 260 of FIG. 2), the row decoder 320 may decode the received row address RA to select one of the word lines WL identified by the received row address RA. The row decoder 320 may activate the selected word line, such as by applying a selection voltage or a selection current to the selected word line. The word lines that are not identified by the received row address RA are typically not selected upon selection and activation of the selected word line, and the row decoder 320 may apply a non-selection voltage or a non-selection current to each of the unselected word lines.

The write drivers and sense amplifiers 330 are connected to the bit lines BL and the source lines SL and are connected to the memory cell array 310 through the bit lines BL and the source lines SL. The write drivers and sense amplifiers 330 may comprise a plurality of write drivers and a plurality of sense amplifiers. The bit lines BL and source lines SL may be arranged in pairs, so that each bit line/source line pair (BL/SL) is connected to a corresponding one of the write drivers and to a corresponding one of the sense amplifiers. In some implementations, each of the write drivers and each of the sense amplifiers may be shared between (and selectively connected to via a corresponding demultiplexer) two or more bit line/source line pairs (BL/SL).

During a write operation, the write drivers may write data to selected memory cells connected to the selected word line by applying voltages or currents to the bit lines BL or the source lines SL. For example, the write drivers may perform a set operation or a reset operation on the selected memory cells (connected to the selected word line WL) to change resistance values of these selected memory cells, thus writing data to the selected memory cells.

During a read operation, the sense amplifiers may read data from the selected memory cells (connected to the selected word line WL) by sensing voltages or currents of the provided by pairs of the bit lines BL and source lines SL. For example, the sense amplifiers may perform the read operation on the selected memory cells to detect resistance values of the selected memory cells, thus reading data of the selected memory cells.

The gating block 340 may be connected to the write drivers and sense amplifiers 330 through data lines DL. The gating block 340 may be controlled by the column decoder 350. The gating block 340 may comprise a set of switches (e.g., of a multiplexer/demultiplexer) that transfer the data signals DQ between the input and output buffer 220 and selected ones of the write drivers and sense amplifiers 330. For example, the gating block 340 may connect a selected subset of the write drivers and a selected subset of the sense amplifiers of the write drivers and sense amplifiers 330 with the input and output buffer 220. These subsets of write drivers and sense amplifiers may be selected by the column decoder 350 in response to decoding the received column address CA.

The column decoder 350 may receive the column address CA from the second demultiplexer 270. The column decoder 350 may control the gating block 340 depending on the column address CA. For example, depending on the column address CA, the gating block 340 may select a subset of write drivers and a subset of sense amplifiers identified by the received column address CA to connect the same to the input and output buffer 220 via the gating block 340.

In some embodiments, the gating block 340 may be shared by adjacent banks. For example, first to fourth banks 211 to 214 may share a first gating block 340, and the fifth to eighth banks 215 to 218 may share a second gating block 340. For banks sharing the same gating block 340, the gating block 340 may select the same subsets of the write drivers and sense amplifiers 330 of those banks depending on the received column address CA.

Figure 4:
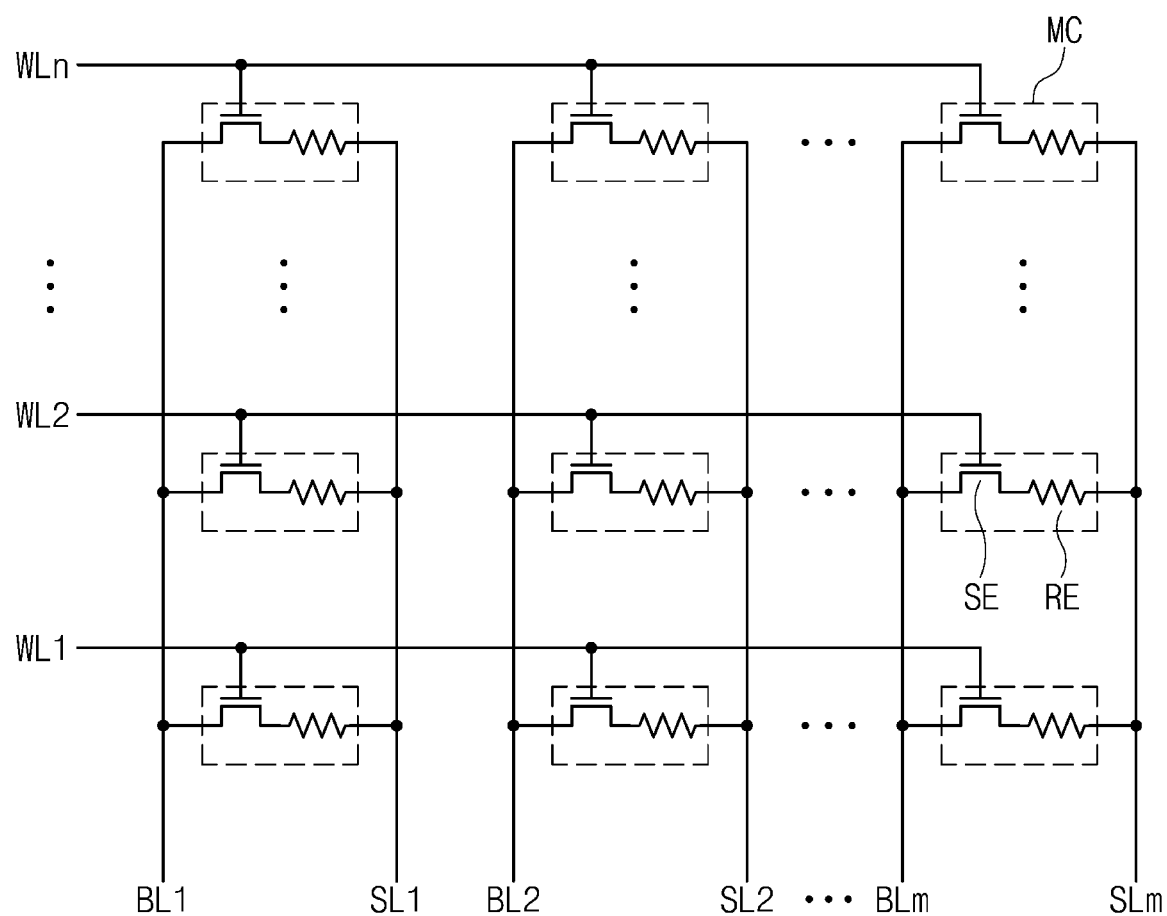
FIG. 4 is a diagram illustrating a memory cell array.

FIG. 4 is a diagram illustrating exemplary details of aspects of the memory cell array 310 of FIG. 3. Referring to FIG. 4, the memory cell array 310 comprises a plurality of memory cells MC arranged in rows and columns. The 1 to n rows of the memory cells MC are connected word lines WL1 to WLn, respectively. The 1 to m columns of the memory cells are connected to first to m-th bit lines BL1 to BLm, respectively, and connected to first to m-th source lines SL1 to SLm, respectively.

In this example, memory cell MC is connected to one word line WL, one bit line BL, and one source line SL. Each of the memory cells MC includes a selection element SE and a resistance element RE. The selection element SE may be a switch and controlled by the corresponding word line, and may electrically connect the resistance element RE between the corresponding bit line BL and the corresponding source line SL. In this example, the selection element SE is a transistor which is controlled by a voltage of a word line to selectively connect the corresponding resistance element RE between the corresponding bit line BL and corresponding source line SL.

The resistance element RE is a variable resistor and may have a resistance value which is changed by the set operation or the reset operation. The resistance element RE may be connected between the corresponding bit line BL and the corresponding source line SL together with the selection element SE. The resistance element RE may include a phase change material (e.g., a chalcogenide such as GST) having a resistance value which varies according to a phase state of the phase change material.

In other embodiments, instead of a transistor, a diode may be used as the selection element SE. In this case, the selection element SE and the resistance element RE of a memory cell MC may be connected in series between the corresponding word line and the corresponding bit line and source lines SL may be omitted. As another example, the selection element SE may be omitted, and the resistance element RE of a memory cell MC may be connected between the corresponding word line and the corresponding bit line and source lines may be omitted.

Figure 5:
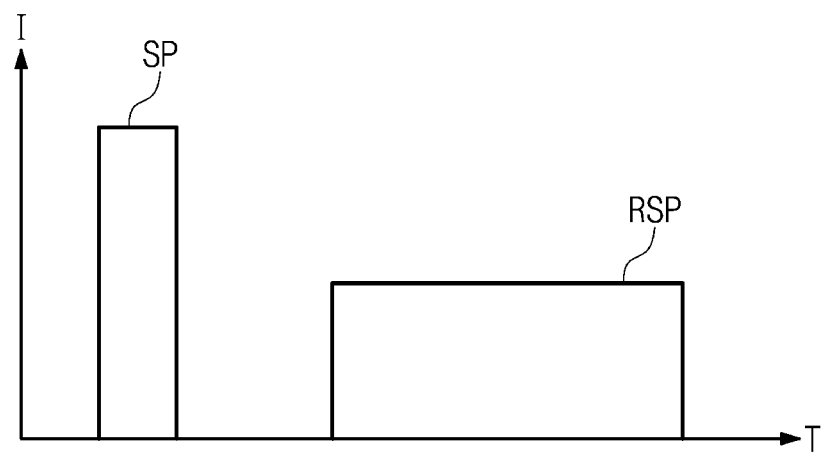
FIG. 5 is a diagram illustrating an example of a set pulse and a reset pulse causing a set operation and a reset operation in memory cells.

FIG. 5 is a diagram illustrating an example of a set pulse and a reset pulse respectively causing a set operation and a reset operation in memory cells MC, such as those described with respect to FIG. 4. In FIG. 5, the horizontal axis represents time "T", and the vertical axis represents current I.

Referring to FIGS. 4 and 5, when the set operation is performed on a memory cell MC, a set pulse SP may be applied to the resistance element RE. When the reset operation is performed, a reset pulse RSP may be applied to the resistance element RE. The set pulse SP may be applied with a shorter duration than the reset pulse RSP. The amount of current of the set pulse SP applied to and flowing through a memory cell MC subject to a set operation may be greater than the amount of current of the reset pulse RSP applied to and flowing through a memory cell MC subject to a reset operation. It will be appreciated that although FIG. 5 illustrates a sequence of a set pulse SP and a reset pulse RSP generated over time, this is for explanation purposes. Generally, each memory cell MC of a row of selected memory cells MC (connected to the selected word line WL) may be subject to application of a set pulse SP and a reset pulse RSP in the same write operation. For example, some selected memory cells of a row of selected memory cells MC may have a corresponding set pulse SP applied thereto while, at the same time, other ones of the selected memory cells MC (which may be all or some of the remaining ones of the selected memory cells MC) may have a corresponding reset pulse RSP applied thereto. Similarly, it also will be appreciated that the sequence of temperature change of a memory cell MC illustrated in FIG. 6 is for ease of description.

Figure 6:
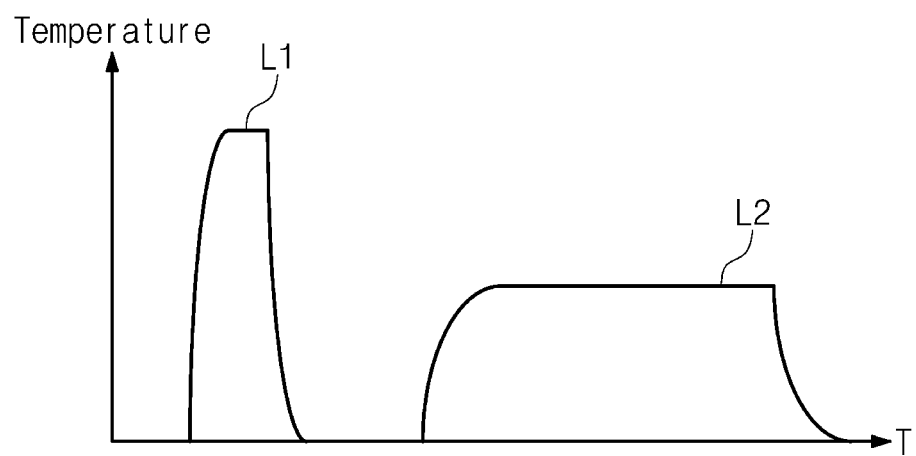
FIG. 6 is a diagram illustrating an example in which a temperature of a resistance element changes by a set pulse and a reset pulse.

FIG. 6 is a diagram illustrating an example in which a temperature of the resistance element RE of memory cell MC changes by the set pulse SP and the reset pulse RSP. In FIG. 6, the horizontal axis represents time "T", and the vertical axis represents temperature. The first line L1 indicates a temperature obtained by the resistance element RE of a memory cell MC due to the application of the set pulse SP, and the second line L2 indicates a temperature achieved by the resistance element RE of a memory cell MC due to application of the reset pulse RSP.

When the set pulse SP is applied, a large current flows through the resistance element RE during a relatively short duration. Accordingly, during this relatively short duration, the temperature of the resistance element RE increases sharply. After this relatively short duration, the temperature of the resistance element RE decreases sharply. As a result of this temperature fluctuation caused by the set pulse SP, the phase change material of the resistance element RE is set to an amorphous state which has a relatively high resistance value (as compared to its crystalline state).

When the reset pulse RSP is applied, a small current flows through the resistance element RE over a relatively long duration (i.e., longer than that of the set pulse SP). Accordingly, the temperature of the resistance element RE increasing slowly and is maintained at a relatively lower temperature (as compared to the peak temperature achieved during application of a set pules SP) for this relatively long duration. After the reset pulse RSP is applied, the temperature of the resistance element RE may decrease relatively slowly. As a result of this temperature fluctuation caused by the reset pulse RSP, the phase change material of the resistance element RE is set to a crystalline state which has a relatively low resistance value (as compared to is amorphous state). The maximum temperature of the resistance element RE obtained when the reset pulse RSP is applied is lower than the maximum temperature of the resistance element RE obtained when the set pulse SP is applied.

As described above, the set operation or the reset operation of the memory cells MC is performed by generating a relatively high temperature by the memory cells MC during a relatively short duration or generating a relatively low temperature by the memory cells MC during a relatively long duration. Both the set operation and the reset operation generate temperatures higher than room temperature. When the set operation or the reset operation are performed by a particular memory cell, the temperature of memory cells adjacent to the particular memory cell may also increase due to the heat generated at the particular memory cell.

In some situations, the temperature of an adjacent memory cells increases to such an extent to cause an undesired set operation or reset operation, disturbing data stored in this adjacent memory cell. Specifically, the resistance of the resistance element RE of the adjacent memory cell may be altered from that previously programmed via a write operation to this resistance element RE where such altered resistance value may no longer represent the data (e.g. one or more data bits) stored by this adjacent memory cell via the write operation. The disturbance may make the integrity of the data stored in the adjacent memory cells low. The checker 112 (e.g., see FIG. 1) according to an embodiment of the inventive concept may check the integrity of data by performing the check read operation on adjacent (or neighbor) memory cells.

If the integrity of data stored in the adjacent (or neighbor) memory cells falls, the checker 112 may perform a follow-up operation for improving the integrity of data. Accordingly, the reliability of the memory module 100 or the nonvolatile memory device 200 is improved.

Figure 7:
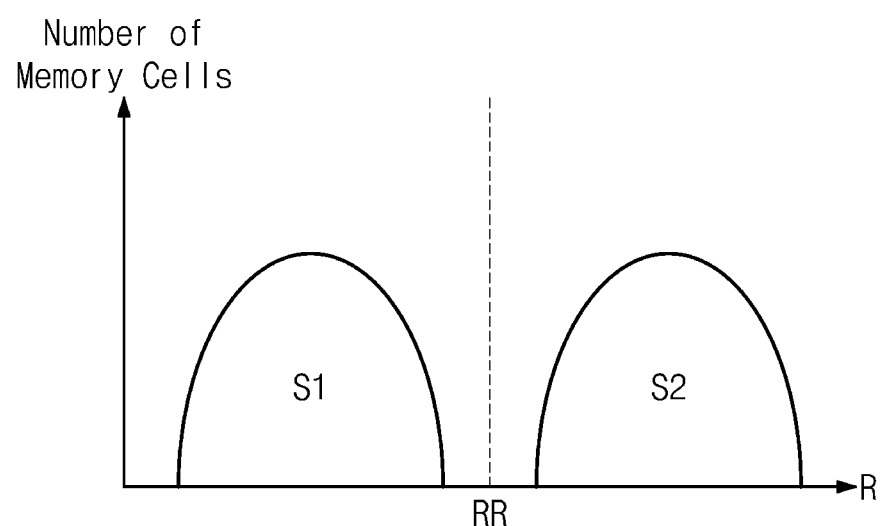
FIG. 7 is a diagram illustrating an example of memory cells, for example, resistance elements of the memory cells.

FIG. 7 is a diagram illustrating an example of a distribution of resistance values "R" of memory cells MC of a row of memory cells. The resistance values "R" may be, for example, the resistance values of resistance elements RE of the memory cells MC of a row of memory cell MC as described herein (e.g., with respect to FIGS. 3 and 4). In FIG. 7, the horizontal axis represents resistance values "R" of the memory cells MC, and the vertical axis represents the number of memory cells MC.

As shown in FIG. 7, memory cells MC of a row of memory cells MC may have a first state S1 or a second state S2. When the reset operation is performed on a memory cell MC by using the reset pulse RSP, the resistance element RE of this memory cell MC may obtain its crystalline state. The crystalline state may correspond to the first state S1 having a relatively low resistance value.

When the set operation is performed on a memory cell MC by using the set pulse SP, the resistance element RE this memory cell MC may be set to its amorphous state. The amorphous state may correspond to the second state S2 having a relatively high resistance value.

The row decoder 320 may select a row of memory cells MC, for example, one word line. Each of the write drivers may selectively perform one of the set operation or the reset operation (in dependence on the data to be stored) by respectively applying the set pulse SP or the reset pulse RSP to the memory cell MC to which it is connected (e.g., via a bit line/source line BL/SL pair) in the selected row of memory cells (connected to the selected word line WL).

By performing the set operations or the reset operations selectively on the memory cells MC in the selected row, the nonvolatile memory device 200 may adjust resistance values "R" of each of the memory cells MC in the selected row to either the first state S1 or the second state S2, thus storing data to the memory cells MC in the selected row.

The row decoder 320 may select one row, for example, one word line to read the data stored in the memory cells MC. The sense amplifiers may each apply a read voltage or a read current to the corresponding memory cell MC to which it is connected in the selected row (e.g., through the corresponding bit line/source line BL/SL pair).

The sense amplifiers may measure the resistance value "R" of each memory cell MC by detecting a cell current or a cell voltage generated by the read voltage or the read current. When the resistance values "R" of the memory cells MC are lower than a reference resistance value RR, the sense amplifiers may determine that these memory cells MC have the first state S1. The reference resistance value RR may be a resistance value RR that is used during a normal read operation of the memory cells MC (e.g., to provide read data to the controller 110 in response to a request from a host, such as controller 10). The different reference resistance values may be provided as different voltages and the comparison of the resistance values "R" of the memory cells MC to a reference resistance value may be in the form of comparison of a voltage responsive to a resistance of a memory cell to the voltage representing the reference resistance value. Alternatively, current values may be compared in a similar manner.

When the resistance values "R" of the memory cells MC are equal to or greater than the reference resistance value RR, the sense amplifiers may determine that these memory cells MC have the second state S2. With respect to the two state representation of FIG. 7, memory cells MC having the first state may be associated and represent a first binary value (i.e., either "0" or "1") and memory cells MC having the second state may be associated and represent a second binary value (i.e., the other of "0" or "1" that is not associated with the first state). It will be appreciated that nonvolatile memory cells may be programmed to more than two states to represent more than one bit of data. For example, memory cell arrays (e.g., 310 of FIGS. 3 and 4) may be formed with arrays of multi-level cells that may be programmed to store two, three, four or more bits of data. It will be appreciated that the invention is equally applicable to nonvolatile memory devices and systems implemented with such multi-level memory cells and related methods.

Figure 8:
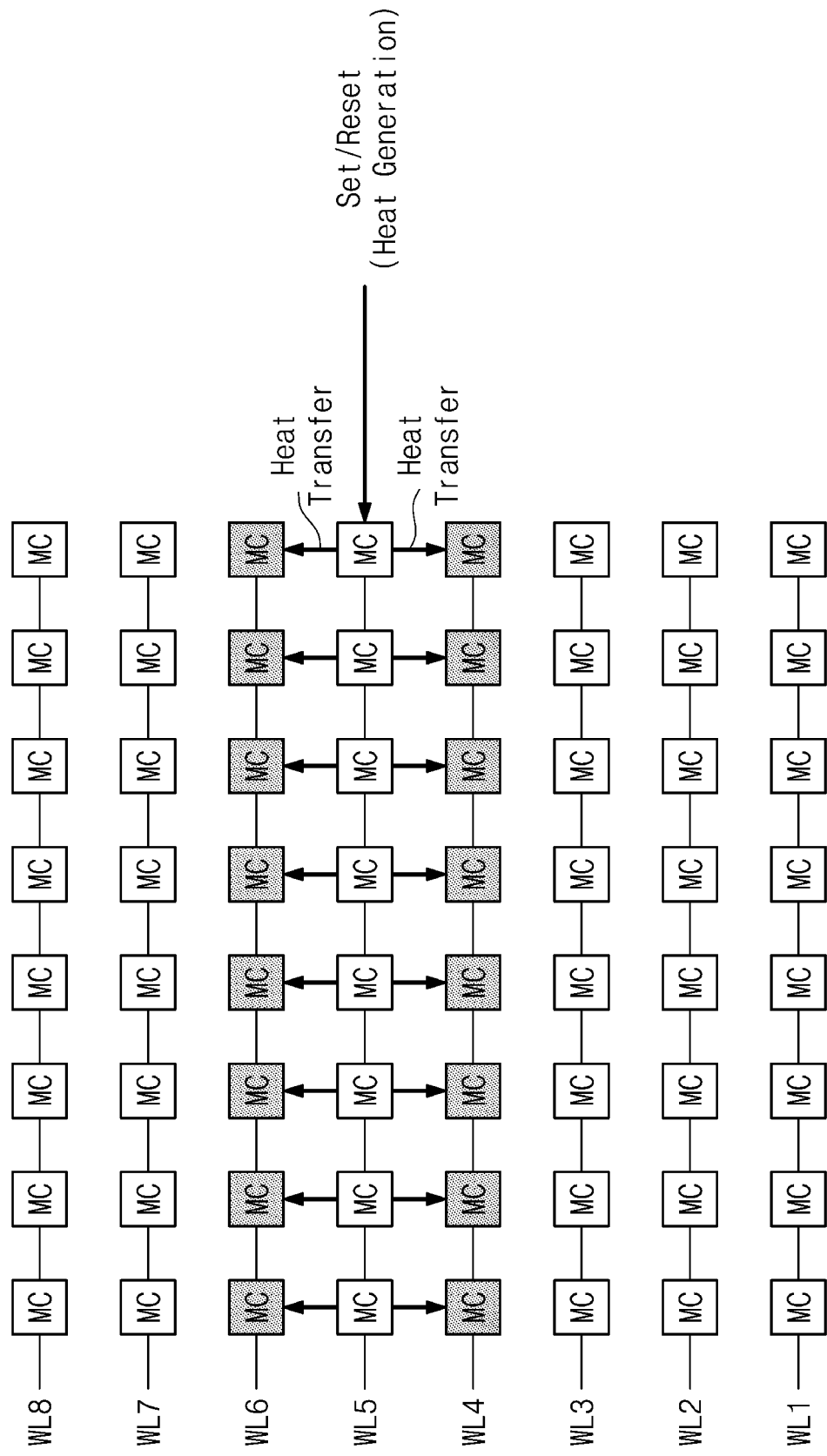
FIG. 8 is a diagram illustrating an example in which write operation is performed on memory cells in a particular row.

FIG. 8 is a diagram illustrating an example in which data is written to a selected row of memory cells MC, here with a set operation or a reset operation being performed on each of the memory cells MC in the selected row. In this example, the row decoder 320 has selected and activated a fifth word line WL5. Each of the write drivers may perform the set operation or the reset operation on a corresponding memory cell MC of the fifth word line WL5.

As described with reference to FIG. 6, heat may be generated when the set pulses SP and the reset pulses RSP are applied to the memory cells MC of the fifth word line WL5. The heat generated at the memory cells MC of the fifth word line WL5 may be transferred to memory cells MC of a fourth word line WL4 and a sixth word line WL6 adjacent to (neighboring) the fifth word line WL5.

When the heat is transferred to the memory cells MC of the fourth word line WL4 and the sixth word line WL6, a weak reset operation may be performed on the memory cells MC of the fourth word line WL4 and the sixth word line WL6.

Figure 9:
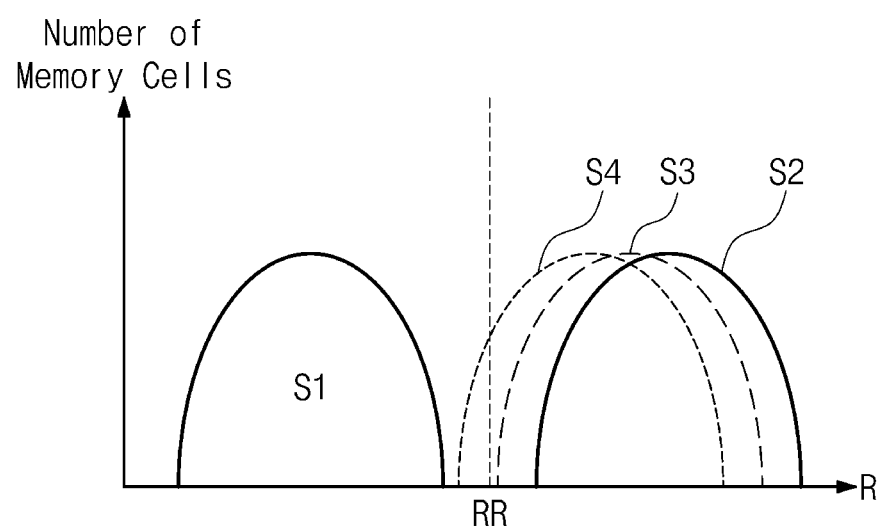
FIG. 9 is a diagram illustrating an example in which a weak reset operation is performed on adjacent neighbor memory cells.

FIG. 9 is a diagram illustrating an example in which a weak reset operation is performed on memory cells adjacent to those being programmed via a write operation (which may simply referred to as "adjacent memory cells" herein and may comprise a row of memory cells immediately adjacent a row of memory cells being programmed). Referring to FIG. 9, the memory cells MC may be weakly reset repeatedly, resistance values "R" of the memory cells MC may decrease from the second state S2 to a third state S3 and then to a fourth state S4. When the resistance values "R" of the memory cells MC initially programmed to the second state S2 becomes lower than the reference resistance value RR, a read error may occur when reading data from a row including these memory cells MC.

In some examples, a weak set operation may be performed on adjacent neighbor memory cells. As the memory cells MC repeatedly experience the weak set operation, the resistance values "R" of the memory cells MC may increase. When the resistance values "R" of the memory cells MC initially programmed to the first state S1 becomes higher than the reference resistance value RR, a read error may occur when reading data from a row including these memory cells MC.

As described above, as the set operation or the reset operation is performed on particular memory cells MC of the nonvolatile memory device 200 (refer to FIG. 2), disturbance may occur with regard to states of the resistance values "R" of adjacent neighbor memory cells MC. If the disturbance accumulates to a certain level, a read error may occur with respect to data stored in the memory cells MC, and the integrity of data may be deteriorated.

The above-described disturbance has been described as occurring when the set operation or the reset operation is performed with regard to an adjacent word line during a write operation. Accordingly, the above-described disturbance may be called "write disturbance". However, the inventive concept is not limited to addressing only write disturbances and is applicable to memory cells MC disturbed by other mechanisms. For example, "read disturbances" (caused by reading data) may be addressed by the present invention.

Figure 10:
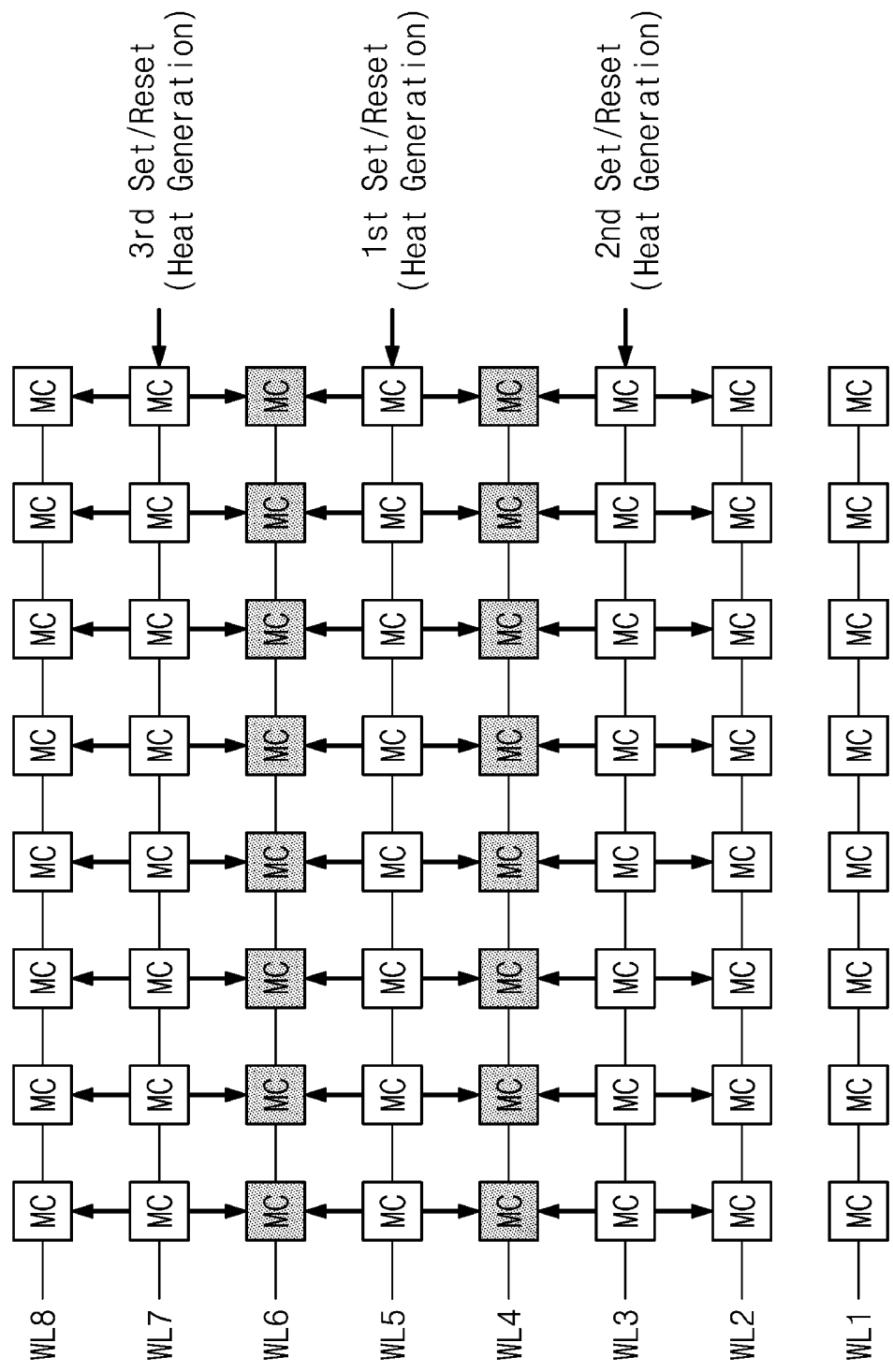
FIG. 10 is a diagram illustrating an example in which disturbance having an influence on particular memory cells is caused by two or more rows of memory cells.

FIG. 10 is a diagram illustrating an example in which disturbance of a particular set of memory cells is caused by two or more rows of other memory cells. Referring to FIG. 10, a first write operation including first set operations and/or first reset operations may be performed on the memory cells MC of the fifth word line WL5. The write operation may cause a write disturbance having an influence on the memory cells MC of the fourth word line WL4 and the sixth word line WL6.

A second write operation including a second set operation and/or a second reset operation, may be performed on memory cells MC of a third word line WL3. The second write operation may cause a write disturbance having an influence on memory cells MC of a second word line WL2 and the memory cells MC of the fourth word line WL4.

A third write operation, including a third set operation and/or a third reset operation, may be performed on memory cells MC of a seventh word line WL7. The third write operation may cause a write disturbance having an influence on the memory cells MC of the sixth word line WL6 and memory cells MC of an eighth word line WL8.

As described above, write disturbance having an influence on the memory cells MC of the fourth word line WL4 may be caused by the write operations of the third word line WL3 or the fifth word line WL5. When data stored in the memory cells MC of the fourth word line WL4 are damaged by the write disturbance, the write disturbance may mostly be attributed to write operations to the third word line WL3 or mostly be attributed to write operations to the fifth word line WL5.

In this example, it is assumed that the write disturbance having an influence on the memory cells MC of the fourth word line WL4 can be attributed to write operations of the third word line WL3. In such a case, data stored in the memory cells MC of both the second word line WL2 and the fourth word line WL4 may be expected to be damaged by the write disturbance caused by write operations to the third word line WL3.

The checker 112 may be configured to check for a cumulative write disturbance of memory cells MC of a neighbor word line adjacent to a word line subject to a write operation. For example, when the write operation is performed on the fifth word line WL5, the checker 112 may check cumulative write disturbance of the memory cells MC of the fourth word line WL4 and the sixth word line WL6, both of which are adjacent to the fifth word line WL5.

In this example, we assume that as a result of the check operation, the checker 112 may detect that data stored in the memory cells MC of the fourth word line WL4 are damaged by the write disturbance. However, if the checker 112 only checks memory cells of word lines immediately adjacent the word line subject to the write operation (in this example, WL5 is subject to the write operation), the checker 112 will fail to detect that data stored in the memory cells MC of the second word line WL2 are damaged by the write disturbance.

The data stored in the memory cells MC of the second word line WL2 may be left alone in a damaged state and may be continued to be damaged to such an extent so that error correction-based recovery is no longer possible. Accordingly, a portion of data written to the nonvolatile memory device 200 may be permanently damaged.

To solve the above issue, the checker 112 according to an embodiment of the inventive concept may be configured to perform the check read operation on neighbor word lines WL (e.g., second order neighbor word lines) adjacent to a word line where a check operation is performed, as well as memory cells MC of neighbor word lines WL (e.g., first order neighbor word lines) immediately adjacent to a word line where the write operation is performed.

The checker 112 according to an embodiment of the inventive concept may be configured to perform a check read operation on neighbor word lines including n-th order neighbor word lines (n being a positive integer), when a condition for performing the check read operation is satisfied.

Figure 11:
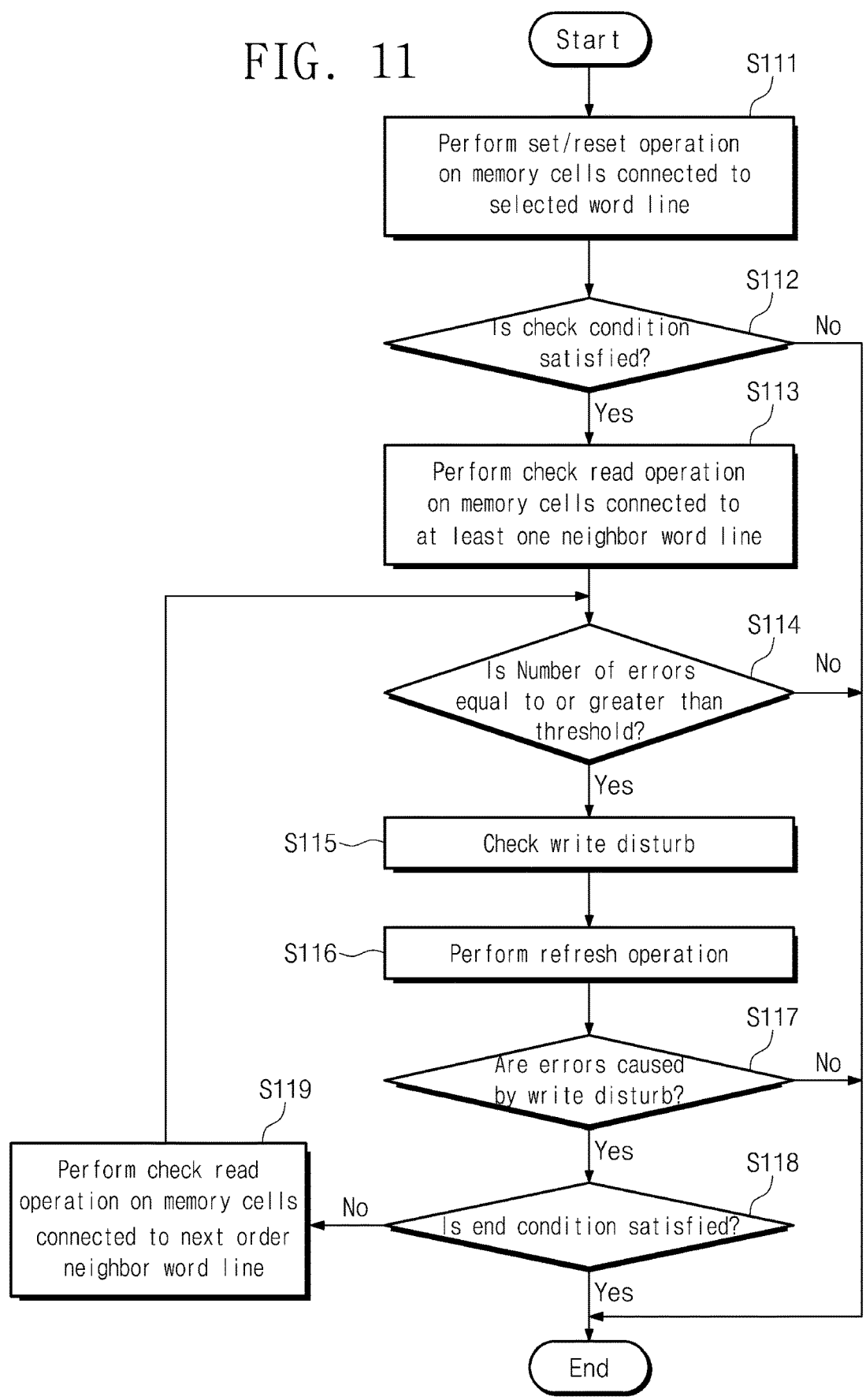
FIG. 11 is a flowchart illustrating an exemplary operating method of a semiconductor device.

FIG. 11 is a flowchart illustrating an operating method of the according to an embodiment of the inventive concept. The method may be implemented by memory systems, such as the memory module 100 described herein or may be implemented by a semiconductor memory device, such as memory module 100 and/or nonvolatile memory device 200 described herein. The following is described with respect to the memory module 100 of FIG. 1 and nonvolatile memory device 200 but is equally applicable to other implementations. Referring to FIGS. 1 to 4 and 11, in operation S111, the controller 110 may perform a write operation including the set operation and/or the reset operation on memory cells MC connected to a selected word line.

For example, the controller 110 may simultaneously perform set operations and reset operations to rows of memory cells connected to identical word lines (i.e., word lines identified by the same row address) at selected banks of the first nonvolatile memory devices 121 to 129 or at selected banks of the second nonvolatile memory devices 131 to 139.

In operation S112, the checker 112 of controller 110 may determine whether a check condition is satisfied. For example, when the number of write operations performed with any particular bank of any of the first nonvolatile memory devices 121 to 129 or the second nonvolatile memory devices 131 to 139 reaches a particular value, the checker 112 may determine that the check condition of the particular bank is satisfied.

When the check condition is not satisfied, the checker 112 does not perform the check read operation. The write operation thus ends without performing a check read operation. When the check condition is satisfied, operation S113 is performed. In operation S113, the checker 112 may cause the controller 110 to perform the check read operation on memory cells MC connected to at least one neighbor word line adjacent to the selected word line (selected during the write operation of step S111).

For example, the check read operation may be the same as a general read operation. The controller 110 may perform the check read operation with regard to a particular bank of each of the first nonvolatile memory devices 121 to 129 or the second nonvolatile memory devices 131 to 139. The controller 110 may receive data read from the first nonvolatile memory devices 121 to 129 or the second nonvolatile memory devices 131 to 139.

In operation S114, the controller 110 may determine whether the number of bit errors of the received data is equal to or greater than a threshold. When each nonvolatile memory device provides data having a number of bit errors smaller than the threshold, the check read operation ends.

For example, the controller 110 may determine that a result of the check read operation indicates that the reliability of data is high. Since the reliability of data is high, the controller 110 may terminate the check read operation without performing a follow-up operation for improving the reliability. When the number of bit errors of the data is high, such as the number of bit errors received from any of the nonvolatile memory devices being equal to or greater than the threshold, operation S115 is performed. In addition, when the number of bit errors of the data is identified as high in step S114, the row of memory cells storing the data is identified as requiring a refresh operation (step S116). Note that the order of steps S115 and S116 may be switched in the method of FIG. 11. In addition, as discussed below, the performance of the refresh operations in step S116 for each row identified as requiring a refresh operation in step S114 may be delayed while the remainder of the method of FIG. 11 is performed (e.g., the operational loop comprising steps S119, S114, S115, S117 and S118 may be repeatedly performed and the refresh operation of S116 of each row of memory cells identified as requiring a refresh operation in S114 may be performed at a later time, such as during an idle time of the nonvolatile memory device).

For example, the controller 110 may determine that the result of the check read operation indicates that the reliability of data is low. The controller 110 may perform operation S115 for the purpose of performing the follow-up operation for improving the reliability. In operation S115, the controller 110 may check the write disturbance of memory cells where an unacceptably high number of bit errors have been detected in S114.

For example, as described with reference to FIG. 9, the write disturbance may cause a decrease in resistance values "R" of memory cells of the second state S2 or an increase in resistance values "R" of memory cells of the first state S1. The controller 110 may determine whether the errors arise from the write disturbance, by additionally performing read operations (e.g., check read operations) on the memory cells where the high bit error has been detected in step S114 (e.g., memory locations, such as rows of memory cells, where the number bit errors is equal to or greater than the threshold).

The controller 110 may check whether the number of bit errors change when check read operations are performed on the same memory cells (e.g., same row of memory cells adjacent the using different reference resistance values. For example, a row of memory cells may be subject to several check read operations using different resistance values as a reference (in a manner similar to standard read operations using the reference resistance value RR) by comparing each of the resistance values "R" of the memory cells (i) with the reference resistance value RR, (ii) with a first resistance value smaller than the reference resistance value RR, and (iii) with a second resistance value smaller than the first resistance value to obtain three corresponding sets of read data and a number of bit errors of each set of read data. When the number of bit errors in the read data read from the memory cells obtained from in each of these check read operations decreases in the order of (i) the read data obtained using the reference resistance value RR, (ii) the read data obtained using the first resistance value and (iii) the read data obtained using the second resistance value, the controller 110 may determine that the errors arise from the write disturbance.

In some examples, the controller 110 may check whether the number of bit errors change using comparative resistance values that increase with respect to the reference resistance value RR. For example, a row of memory cells may be subject to several check read operations using different resistance values as a reference by comparing each of the resistance values "R" of the memory cells (i) with the reference resistance value RR, (ii) with a third resistance value greater than the reference resistance value RR, and (iii) with a fourth resistance value greater than the third resistance value to obtain three corresponding sets of read data and a number of bit errors of each set of read data. When the number of bit errors in the read data read from the memory cells obtained from in each of these check read operations decreases in the order of (i) the read data obtained using the reference resistance value RR, (ii) read data obtained using the third resistance value and (iii) read data obtained using the fourth resistance value, the controller 110 may determine that the errors arise from the write disturbance.

When it is determined that the bit errors arise from the write disturbance, the controller 110 may perform a first follow-up operation (e.g., operation S116) for correcting the bit errors due to the write disturbance and a second follow-up operation (e.g., operation S117 to operation S119) for checking high order write disturbance (which may include checking for write disturbance of other rows of memory cells as described herein).

The first follow-up operation or the second follow-up operation may be performed immediately following the check read operation. For another example, the controller 110 may reserve the first follow-up operation (S116) and/or the second follow-up operation (S117 to S119) such that the first follow-up operation or the second follow-up operation is performed during an idle time when no tasks (e.g., no outstanding access operations need to be completed) have been assigned to the nonvolatile memory device by the memory controller 10. As one example, the method of FIG. 11 may be performed in the sequence shown in FIG. 11 except that step S116 may be initially skipped for each row of memory cells identified as having an unacceptably high number of bit errors in S114. The operational loop of steps S119, S114 to S118 (except skipping S116) may be repeated until the method of FIG. 11 would otherwise have been terminated (e.g., just prior to "End" of FIG. 11). Having identified a plurality of rows of memory cells that require a refresh operation (e.g., a row identified each time step S114 determination is "Yes"), the refresh operation of step S116 may then be performed for each of these rows of memory cells during an idle time. In some examples, the plurality of rows identified as requiring a refresh operation (due to repeated performance of step S114) may identify a block of memory cell rows (e.g., a continuous segment of memory comprising a plurality of memory cell rows) that are to be refreshed. For example, each memory cell row in a range of memory cell rows extending between the two outermost memory cell rows of all memory cell rows identified to be refreshed by step S114 (in a particular bank) may be identified as requiring a refresh operation. The range of memory cell rows to be refreshed may correspond to a range of a minimum row address to a maximum row address of the row addresses of all word lines identified to be refreshed by step S114 during the execution of the method of FIG. 11.

In operation S116, the memory cells MC may be subject to a refresh operation. The refresh operation includes writing data read through the check read operation (e.g., during S111 or S113) back to the same memory cells MC with the bit errors of the data corrected (e.g., data having no bit errors). In some examples, all of the memory cells MC may first be erased (or initialized) (e.g., an entire row of memory cells MC) from which the data has been previously read through the check read operation, by performing the reset operation or the set operation on the memory cells MC. The bit error corrected data may then be written by performing the set operation or the reset operation selectively on memory cells MC from which the data has been previously read through the check read operation. In some examples, the bit error corrected data may be written in a single write operation over the data containing the bit errors (e.g., without a prior erase operation) by selectively performing a set operation on some of the memory cells MC and selectively performing a reset operation on other memory cells MC (e.g., the remaining ones of the memory cells MC).

The controller 110 may control the operations of the nonvolatile memory device in performing the refresh operation of step S116. For example, the controller 110 may determine the number of bit errors of the data in step S111 and S114 and detect which bits of the read data are error bits from the data read through the check read operation (obtained, e.g., in S111 or S114). The controller 110 may invert the logic states of bits of data determined to be error bits and perform a write operation on the nonvolatile memory device to store the bit error corrected data in the memory cells MC (e.g., those having the corresponding read data with bit errors). Thus, the controller 110 may correct the bit errors of the read data by inverting the logic state of bits of data stored in memory cells corresponding to error bits by selectively performing the set operation or the reset operation on the corresponding memory cells.

For example, the controller 110 may detect memory cells, which should have the first state S1 (refer to FIG. 7) or the second state S2, from the data read through the check read operation. The controller 110 may recover data of the detected memory cells by performing the set operation or the reset operation on the detected memory cells.

When it is determined in operation S117 that the errors do not arise from the write disturbance, the check read operation ends. When it is determined in operation S117 that the errors arise from the write disturbance, operation S118 is performed. In operation S118, the controller 110 may determine whether an end condition is satisfied. The end condition may be a condition which allows the controller 110 to terminate the check read operation even though the check read operation would otherwise have been performed.

For example, the end condition of S118 may be satisfied when the operational loop of steps S119, S114 to S117 has been performed a predetermined number of times, when a refresh operation attempted to be performed pursuant to operation S116 is unsuccessful (e.g., check read operations to check successful writing of bit error free data resulting from multiple write operations in step S116 has been performed a predetermined number of times without successfully writing bit error free data), and/or the controller 110 determines that other operations to be performed by the nonvolatile memory device (e.g., access operations to the nonvolatile memory device resulting from requests from a host) have priority over continuing method of FIG. 11 to perform further check read operations and refresh operations pursuant to the operational loop of steps S119, S114 to S117. In some examples, the end condition may be satisfied when an address (or a physical location) at which the write is performed or an address (or a physical location) at which the check read operation is performed belongs to a particular range (e.g., as identified by one or more registers of the controller 110) or corresponds to a boundary of a bank of the nonvolatile memory device.

When the end condition is satisfied, the check read method of FIG. 11 ends. When the end condition is not satisfied, operation S119 is performed. In operation S119, the checker 112 may direct the controller 110 to perform the check read operation on memory cells MC connected to a next order neighbor word line. The check read operation may be performed by comparing resistance values of each of the memory cells MC to the reference resistance value RR. The next order neighbor word line may be the word line that is closest to the selected word line (in S111) that is located (i) on the same side of the selected word line (in S111) as the immediately adjacent word line initially subject to the check read operation (in S113) and (ii) is an odd number of word lines away from the selected word line (S111).

After the check read operation is performed on the memory cells MC connected to the next order neighbor word line (next order row of memory cells), the controller 110 may perform operation S114 again. That is, the number of bit errors may be detected from a result of the next order check read operation, and whether the bit errors are caused by a write disturbance may be checked. In the case where the number of bit errors in data read from next order neighbor word line is equal to or greater than the threshold (S114) and the bit errors are determined to be caused by write disturbance (S117), the operational loop of steps S119, S114 to S117 may be repeatedly performed for the next order neighbor word lines to perform corresponding check read operations and refresh operations.

Thus, for word lines located on one side of the selected word line (e.g., selected for a write operation in S111), a check read operation and a corresponding refresh operation may be sequentially performed for word lines that are an odd number of word lines away from the selected word line (S111). It should also be appreciated that the continuation of the operational loop of steps S119, S114 to S117 has been described with respect to word lines located to one side of the selected word line (in S111). However, when operation S113 includes a check read operation of each word line immediately adjacent the selected word line (in S111), such as on two sides of the selected word line (in S111), or on four sides of the selected word line (e.g., in a 3D memory cell array), the operational loop of steps S119, S114 to S117 may be performed separately for each set of wordlines corresponding to the side of the selected word line (in S111) on which the initial check read operation of an immediately adjacent word line is performed in step S113.

Figure 14:
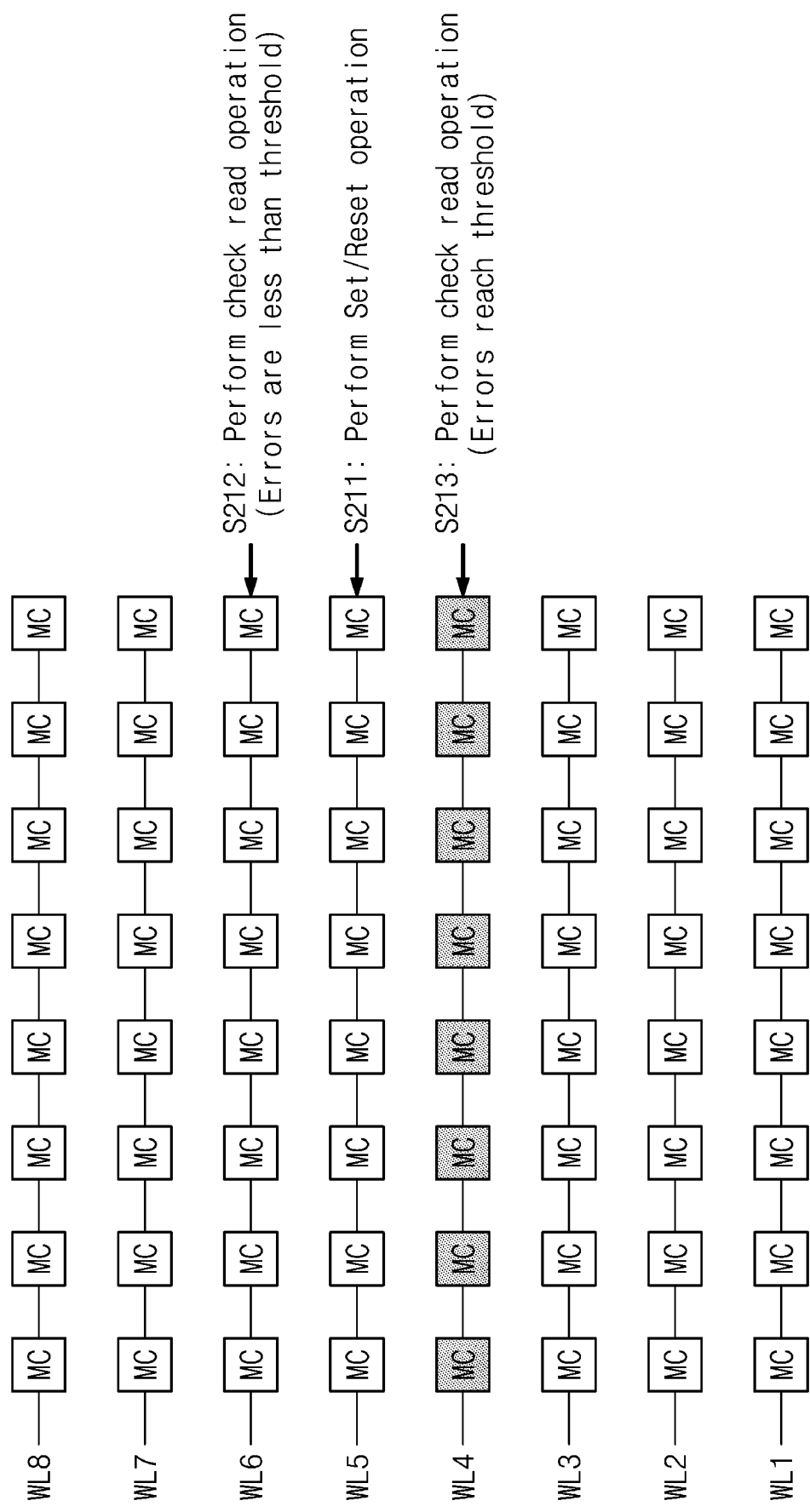
FIG. 14 is a diagram illustrating an example in which a check read operation is performed on memory cells.
Figure 15:
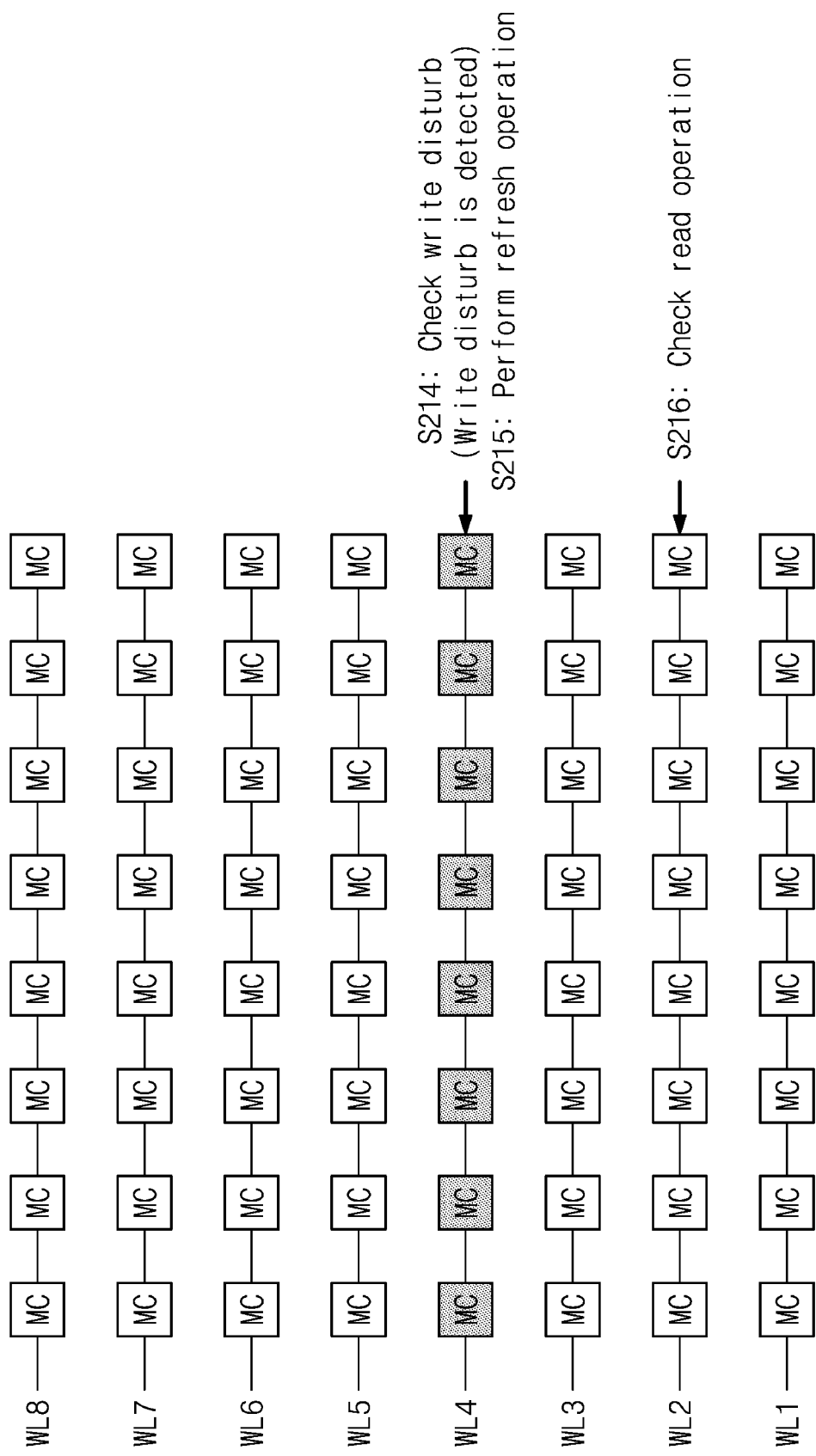
FIG. 15 is a diagram illustrating an example of a check read operation which is performed following FIG. 14.

For example, assume a bank of a nonvolatile memory device comprises n word lines WL1 to WLn, where n is an integer (e.g., n=8 in FIGS. 10, 14 and 15, but n may be an integer greater than 8, such as 1024 or greater or 2048 or greater, etc.). Each of the n word lines may be individually activated by a row decoder of the bank in response to a corresponding row address (e.g., provided by controller 110) that uniquely identifies the word line to provide access to a row of memory cells connected to the activated (selected) word line. Assume a word line WLs is selected for a write operation in operation S111, where s in an integer of 1 to n, and WLs is one of WL1 to WLn. In this example, a word line WL(s+1) immediately adjacent word line to the selected word line WLs is subject to the check read operation (S113), and has its bit errors compared to a threshold (S114), is checked for write disturb (via the operations of S115), refreshed (S116) and has bit errors (obtained from multiple check read operations using different read resistance values in S115) analyzed to determine if bit errors are from write disturb (S117). Assuming the bit errors are determined to be from write disturb (and no end condition is satisfied in S118), step S119 may be performed with respect to WL(s+p), where p=(2i-1), where i is an integer initially equal to one (1) and incremented each time the operational loop of S119, S114 to S117 is performed with respect to this particular side of the selected word line WLs (i.e., each time it is determined to perform a check read operation in S119 for a next order word line for those word lines on this same side of the selected word line WLs as WL(s+1)—the immediately adjacent word line to the selected word line WLs subject to the initial check read operation of S113).

As noted, word lines on multiple sides of the selected word line WLs may be checked for write disturb and refreshed if appropriate. Thus, S113 may also include performing a check read operation for word line WL(s-1), a word line immediately adjacent to the selected word line WLs on the other side of WLs as compared to WL(s+1). Steps S114, S115, S116 and S117 may also be performed with respect to WL(s-1). Assuming the bit errors are determined to be from write disturb (and no end condition is satisfied in S118), step S119 may be performed with respect to WL(s-p), where p=(2i-1), where i is an integer initially equal to one (1) and incremented each time the operational loop of S119, S114 to S117 is performed with respect to this particular side of the selected word line WLs (i.e., each time it is determined to perform a check read operation in S119 for a next order word line for those word lines on this same side of the selected word line WLs as WL(s-1)—an immediately adjacent word line to the selected word line WLs subject to the initial check read operation of S113). Thus, the operational loop of S119, S114, S115, S116 and S117 may be repeatedly performed individually for each side of the selected word line WLs (in S111) and thus, plural operational loops may be performed sequentially (or with individual steps performed in an interlaced fashion) and the termination of one operational loop may not require termination of another one of the operational loops.

Thus, for word lines located on one side of the selected word line (e.g., selected for a write operation in S111), a check read operation and a corresponding refresh operation may be sequentially performed for word lines that are an odd number of word lines away from the selected word line (S111) while avoiding the same check read operations and further evaluation described with respect to steps S119, S114 to S117 for word lines that are an even number of word lines away from the selected word line (in S111).

However, it should be appreciated that it may be desirable that refresh operations for word lines that are an even number of word lines away from the selected word line (in S111) are performed for any such word line that is located between two word lines that were subject to a refresh operation in S116 (and spaced an odd number of word lines away from the selected word line (in S111)) and/or considered to have bit errors caused by write disturbance in S117 (and spaced an odd number of word lines away from the selected word line (in S111)). For such word lines spaced an even number away from the selected word line (in S111) (i.e., having an odd number of word lines interposed between such word lines and the selected word line (in S111)), a single read operation, bit error detection and bit error correction may be performed (in order to implement a corresponding refresh operation). However, the operations of steps S114, S115 and/or S117 may be omitted. For example, in performing refresh operations for word lines spaced an even number away from the selected word line (in S111), one or more or all of the following operations may be avoided: determining to perform a refresh operation based on a number of bit errors (S114), checking for write disturb and/or performing multiple read operations of the word line with multiple read values (S115), and determining if bit errors are caused by write disturb (S117). In the example discussed above, the word lines spaced an even number away from the selected word line are WL(s+p) and WL(s−p), where p=(2i) (and where, for each side of the selected word line WLs, i is an integer equal to 1 to a number of operational loops S119, S114 to S117 performed as discussed above).

As described above, the memory module 100 according to an embodiment of the inventive concept may perform the check read operation when the check condition is satisfied. In the case where the number of bit errors caused by the write disturbance are detected from resultant data of the check read operation are equal to or greater than the threshold, a next order check read operation is performed. Accordingly, the reliability of data stored in the memory cells MC is improved.

The above described embodiment regarding FIGS. 1 to 11 describes the checker 112 as part of the controller 110. However, a checker 112 may be provided in the control logic block 250 of the nonvolatile memory device 200 of FIG. 2. When the invention is embodied as a memory module, such as 100 of FIG. 1, each of the first nonvolatile memory devices 121 to 129 and the second nonvolatile memory devices 131 to 139 may include a checker 112 configured to perform the check read operations and a refresh operations described herein automatically (e.g., without control or receiving instructions from an external source, such as from controller 110). Thus, a plurality of checkers 112 may be provided, each formed in the nonvolatile memory semiconductor chip (e.g., when each of the first nonvolatile memory devices 121 to 129 and the second nonvolatile memory devices 131 to 139 are formed as semiconductor chips). In implementing a checker in a nonvolatile memory semiconductor chip, bit error detection and bit error correction may be performed on-chip (with an on-chip ECC circuit being provided in each nonvolatile memory semiconductor chip). In some examples, the checkers 112 may be provided on-chip, each being part of a corresponding nonvolatile memory semiconductor chip, where each checker does not include a random number generator 116 but either obtains a random number RN from an external source (e.g., a random number generator 116 of the controller 110) or obtains a sequence of numbers (which may or may not be random), such as numbers programmed in registers of the nonvolatile memory semiconductor chip, e.g.

Figure 12:
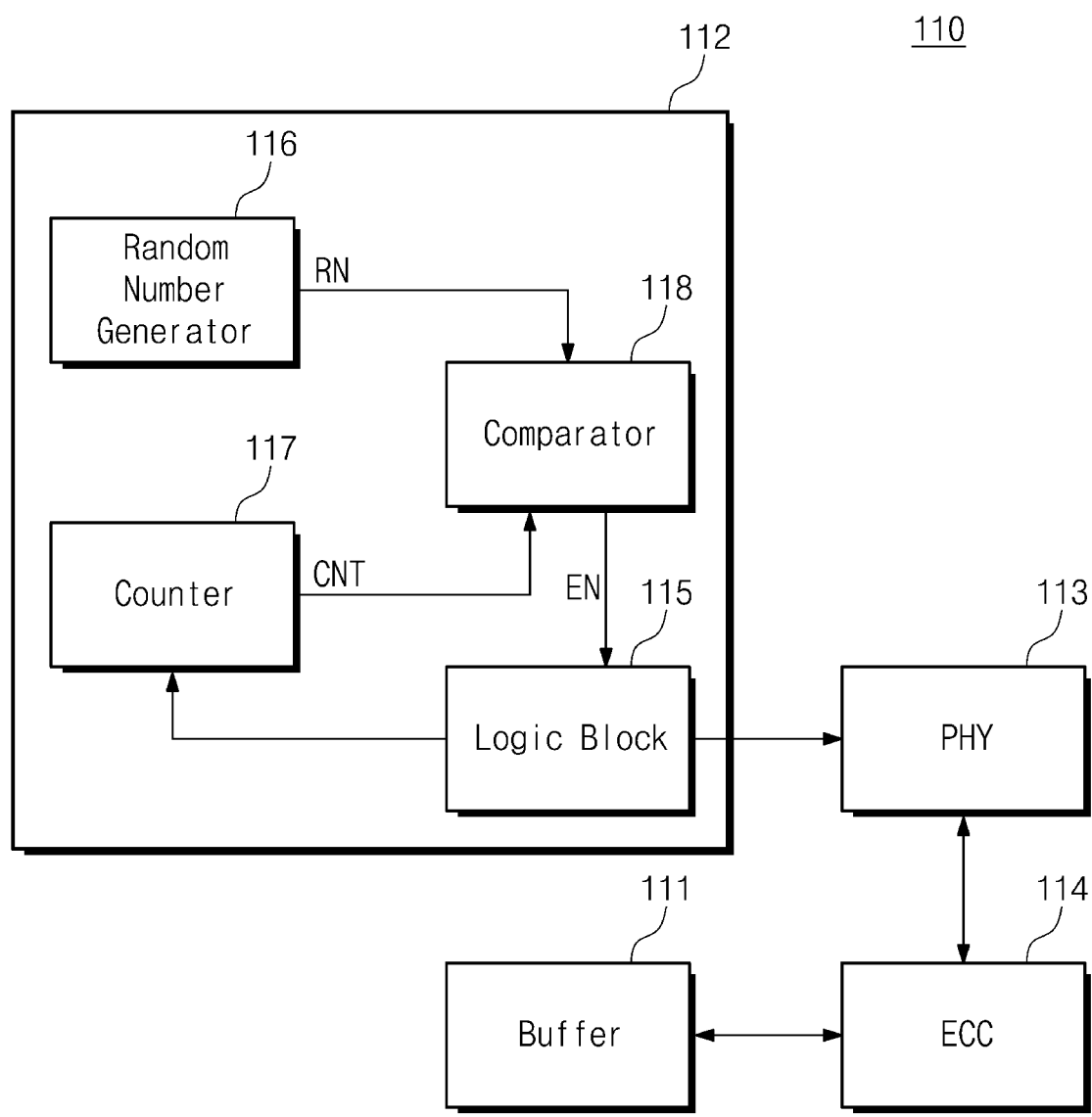
FIG. 12 is a block diagram illustrating an exemplary controller according to an embodiment of the inventive concept.

FIG. 12 is a block diagram illustrating the controller 110 according to an embodiment of the inventive concept. Referring to FIGS. 1 and 12, the controller 110 includes the buffer 111, the checker 112, a physical block 113, and an error correction block 114.

The buffer 111 is configured to store data to be written to one or more of the first nonvolatile memory devices 121 to 129 and the second nonvolatile memory devices 131 to 139 and to store data read from one or more of the first nonvolatile memory devices 121 to 129 and the second nonvolatile memory devices 131 to 139.

Data to be transferred from the buffer 111 to the first nonvolatile memory devices 121 to 129 or the second nonvolatile memory devices 131 to 139 may be encoded by an error correction code ECC driven by the error correction block 114. Data transferred from the first nonvolatile memory devices 121 to 129 or the second nonvolatile memory devices 131 to 139 to the buffer 111 may be decoded by the error correction block 114.

The error correction block 114 (which also may be referred to herein as an error correction circuit or ECC circuit) may perform error correction encoding to add error correction parity bits (e.g., a parity code) to data. The error correction block 114 may perform error correction decoding in a conventional manner, by using data and error correction parity bits and may detect and correct bit errors. The data transferred from the buffer 111 to the nonvolatile memory devices 121 to 129 and 131 to 139 and received from the nonvolatile memory devices 121 to 129 and 131 to 139 may be in the form of a codeword (initially generated by the encoding operation of the error correction block 114). The codeword may take various conventional forms. The codeword may include a portion in which the data is provided in its original format (prior to encoding by the error correction block 114) (such as a codeword with an ECC check code (e.g., parity code) appended thereto) or the codeword may include the data with a modified format.

The physical block 113 may communicate with the first nonvolatile memory devices 121 to 129 and the second nonvolatile memory devices 131 to 139 to control the same. The physical block 113 may comprise an interface (e.g., input/output buffers and driver) of the controller 110 and exchange the internal data signals DQi and internal data strobe signals DQSi with the first nonvolatile memory devices 121 to 129 and the second nonvolatile memory devices 131 to 139 through the first data bus lines 151 and 152.

The physical block 113 may transfer the internal address ADDRi, the internal command CMDi, and the internal control signals CTRLi to the first nonvolatile memory devices 121 to 129 or the second nonvolatile memory devices 131 to 139 through the first control lines 161 and 162.

The checker 112 includes a logic block 115, a random number generator 116, a counter circuit 117, and a comparator circuit 118. The logic block 115 may control operations of the checker 112 and may determine if a number of bit errors of read data indicate a row of memory cells should be refreshed. The counter circuit 117 may include a plurality of counters, each providing a count CNT related to a corresponding one of banks of the nonvolatile memory devices 121 to 129 and 131 to 139. When a write operation (e.g. the set operation and/or the reset operation) is performed with regard to a particular bank of the first nonvolatile memory devices 121 to 129 or the second nonvolatile memory devices 131 to 139, the logic block 115 may cause the counter circuit 117 to increase a count CNT corresponding to the particular bank. For example, if each of the nonvolatile memory devices 121 to 129 and 131 to 139 includes 8 banks, counter circuit 117 may include seventy-two (72) counters each providing a count tracking a number of write operations of a corresponding bank.

The random number generator 116 may comprise a pseudo random number generator and may generate a set of random numbers RN. The number of random numbers RN may correspond to the number of banks of the first nonvolatile memory devices 121 to 129 and the second nonvolatile memory devices 131 to 139 (e.g., initially generate seventy-two (72) random numbers RN, one for each of the banks). The random number generator 116 may include a plurality of registers that may store the generated random numbers RN. The random number generator 116 may provide the random numbers RN corresponding to the banks to the comparator circuit 118. Random as used in this disclosure includes pseudo random. In this disclosure, a number is considered to be a random number RN if the value of the number is responsive to a random number (which may be a pseudo random number generated by a pseudo random number generator). For example, each of the random numbers RN may be randomly selected from a predetermined set of integers (such as an integers within a predetermine range), the selection of which is determined by a generated random number. In some examples, the selection from a predetermined set of integers may be weighted to increase the chances of selection of some integers over others (the selection being determined by the generation of a random number) to thus target and/or generate an average value of the random numbers RN that are sequentially generated for any one particular bank. In some examples, the output of numbers by generator 116 may not be a random number and instead be a number or sequence of numbers stored in register(s) of generator 116.

The counter circuit 117 may provide a number of counts CNT equal to the number of random numbers RN (e.g., corresponding to the number of banks of the first nonvolatile memory devices 121 to 129 and the second nonvolatile memory devices 131 to 139). Under control of the logic block 115, the counter circuit 117 may increase a count of a bank when a write operation is performed by that bank. The counter circuit 117 may provide the counts CNT of the banks to the comparator circuit 118.

The comparator circuit 118 may compare the counts CNT to the corresponding the random numbers RN. The comparator circuit 118 may comprise a plurality of comparators, each corresponding to one of the banks of the first and second nonvolatile memory devices 121 to 129 and 131 to 139, and each including an input of a count CNT and a random number RN corresponding to the bank to which the comparator corresponds. When a particular count CNT reaches the corresponding random number RN, the corresponding comparator of the comparator circuit 118 may activate an enable signal EN associated with the particular count CNT. When an enable signal EN is activated, the logic block 115 may enter a check read mode and initiate a check read operation for the bank associated with the comparator that activated an enable signal EN (e.g., as described herein, such as with respect to FIG. 11). The bank associated with the comparator that activated an enable signal EN may thus be selected for check read operations. Activation of the enable signal EN may also cause the counter associated with the bank to be reset and cause the random number generator 116 to generate and store a new random number RN for that bank (and thus restart the monitoring of the number of write operations of that bank to later initiate a check read operation for that bank upon another random number of write operations being performed by this bank).

The logic block 115 may communicate with the bank selected for the check read operations via the physical block 113 to perform check read operations on this selected bank, such as described herein, such as in accordance with the method of FIG. 11. For example, when resultant data of the check read operation are received through the physical block 113, the received data may be provided to the error correction block 114 to perform error detection on the received data, and the logic block 115 may obtain the number of bit errors in the received data from the error correction block 114. When the number of bit errors is equal to or greater than the threshold, the logic block 115 may identify the row of memory cells from which the data is read as requiring a refresh operation and as well, perform further read operations of the selected bank (communicating via the physical block 113) for determining whether the bit errors arose from the write disturbance.

The logic block 115 may obtain information about whether the number of bit errors change as the read operations are performed using different resistance reference values, based upon the corresponding number of bit errors provided by the error correction block 114 for each corresponding read data. The logic block 115 may determine whether the bit errors arise from the write disturbance, based on a change of the number of bit errors. When it is determined that the bit errors arise from the write disturbance, the logic block 115 may perform a next order check read operation on the selected bank.

When the number of bit errors is equal to or greater than the threshold, the logic block 115 may perform a refresh operation of the corresponding memory cells as described herein. When the check read operation ends or is completed, the logic block 115 may cause the counter circuit 117 to reset or initialize the particular count associated with the selected bank. Also, the logic block 115 may cause the random number generator 116 to generate a random number associated with the selected bank (and compared to the count associated with the selected bank). The check read mode of the logic block associated with the selected bank may thus be terminated. It should be appreciated that the logic block may enter check read modes for several banks at the same time.

As described above, when the number of times that the set operation or the reset operation is performed on a particular bank reaches a random number, the checker 112 may perform the check read operation on the particular bank. When the check read operation is performed, the random number is updated. Accordingly, the checker 112 may perform random interval neighbor check RINC.

Although not shown in FIG. 12, the controller 110 may further include a separate physical block for communicating with the memory controller 10. The buffer 111 may be further configured to store the external address ADDRe, the external command CMDe, and the external control signals CTRLe received through the separate physical block.

Although not shown in FIG. 12, the controller 110 may further include a controller core for generating the internal address ADDRi, the internal command CMDi, and the internal control signals CTRLi from the external address ADDRe, the external command CMDe, and the external control signals CTRLe stored in the buffer 111.

Figure 13:
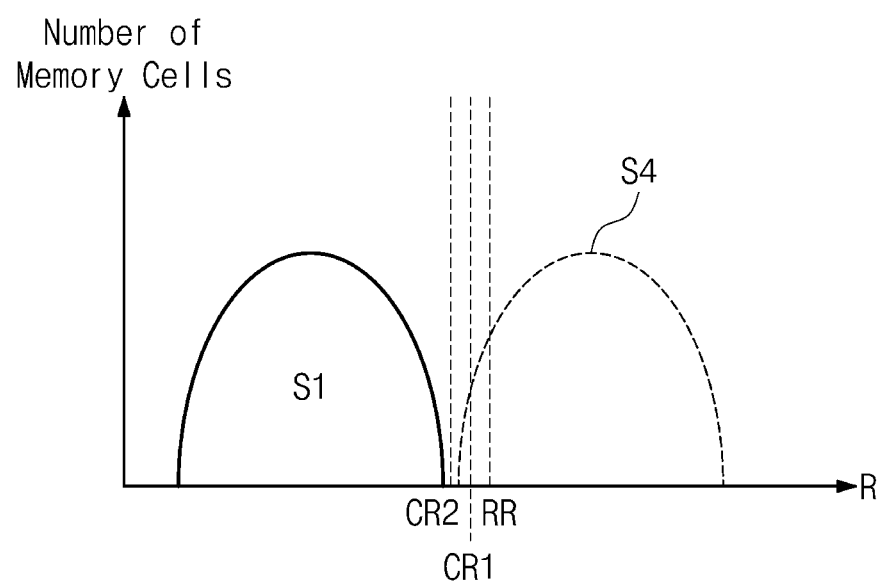
FIG. 13 is a diagram illustrating an example of a method of determining whether errors arise from write disturbance.

FIG. 13 is a diagram illustrating an example of a method of determining whether errors arise from write disturbance. Referring to FIGS. 1 to 9 and 13, memory cells initially programmed to the second state S2 may have their memory cell characteristics (e.g., resistance values) shift to the fourth state S4 due to write disturbance (refer to FIG. 9).

When the check read operation is performed, resistance values "R" of memory cells MC may be compared with the reference resistance value RR. When the number of bit errors of data read through the check read operation is equal to or greater than the threshold, the controller 110 may further perform read operations (e.g., disturbance check read operations) for determining whether bit errors arose from write disturbance.

The controller 110 may perform a first disturbance check read operation and may compare the resistance values "R" of the memory cells MC with a first resistance value CR1 (e.g., a first check read resistance value) lower than the reference resistance value RR. The controller 110 may perform a second disturbance check read operation and may compare the resistance values "R" of the memory cells MC with a second resistance value CR2 (e.g., a second check read resistance value) lower than the first resistance value CR1. The reference resistance value RR may be used in normal read operations of data whereas the first and second resistance values CR1 and CR2 may not be used for normal read operations.

As illustrated in FIG. 13, in the case where resistance values of the memory cells MC are changed by the write disturbance, read operations (e.g., a check read operation and a disturbance check read operation) are performed by using gradually decreasing resistance values, and thus, the number of bit errors gradually decreases. When a decreasing tendency of errors is determined, the controller 110 may determine that the errors arise from the write disturbance.

Likewise, in the case where the number of bit errors gradually decreases as a read operation is performed by using gradually increasing resistance values, the controller 110 may determine that errors associated with memory cells of the first state S1 arise from the write disturbance.

In some examples, the logic block 115 (which may be part of controller 110 or on-chip as part of a nonvolatile memory device semiconductor chip, such as 121 to 129, and 131 to 139) may determine that the number of bit errors is unacceptably high and identify a row of memory cells as requiring a refresh operation (e.g., a "Yes" result in operation S114) and/or check for write disturb without obtaining a number of bit errors detected from error correction block 114 (or other ECC circuit). In some examples, the logic block 115 may determine that the number of bit errors is unacceptably high and identify a row of memory cells as requiring a refresh operation (e.g., a "Yes" result in operation S114) without determining a number of bit errors of the data. For example, data encoding of data to be stored in a nonvolatile memory device may comprise the error correction block 114 performing bit equalization of the data to be stored in any one row of memory cells and the bit equalized data may then be stored in the memory cells of the nonvolatile memory device. Although the bit equalized data of a memory cell row may be the codeword directly generated by the error correction block 114, bit equalized data of a memory cell row may be result from other bit equalization processes (e.g., bit equalization processing of one or more codewords and/or portions of codeword(s) generated by the error correction block 114). The bit equalization of data to be stored in a row of memory cells may result in adjusting the number of logic high bits and the number of logic low bits of a certain set of data (e.g., data to be stored in a row of memory cells) low bits to be about the same (e.g., +/−5% or +/−10% of each other). The bit equalization of data may follow prescribed rules such that the minimum number and maximum number of bits of the data of a row of memory cells is known. Thus, the minimum number and maximum number of logic high ("1") bits and the minimum number and maximum number of logic low ("0") bits of data (without any bit errors) of a row of memory cell may be known (which may be the same minimum and maximum numbers for the data stored in each of the memory cell rows).

Thus, determining that the number of bit errors is unacceptably high and identifying a row of memory cells as requiring a refresh operation (e.g., a "Yes" result in operation S114) may include counting a number of bits of the data of a row of memory cells that are a certain logic level (e.g., counting all logic high ("1") bits and/or counting all logic low ("0") bits) and determining if the resulting count falls within a predetermined range (e.g., corresponding to a known minimum and known maximum of the logic bits that can exist in error free data of the row of memory cells after performing bit equalization). For example, the count of logic bits of a certain logic value may be compared to with a first threshold value to determine if the count is less than the first threshold and may be compared the count to a second threshold value to determine if the count is greater than the second threshold. If the count of logic bits is less than the first threshold or if the count of logic bits is greater than the second threshold, the logic block 115 may determine that the number of bit errors is unacceptably high and identify the row of memory cells (storing the data that has had its logic bits counted) as requiring a refresh operation ("Yes" in operation S114). The first threshold and second threshold may be, respectively, the known minimum number and known maximum number of the logic bits that would exist in error free data after performing bit equalization of the data stored in the row of memory cells (or may be this known minimum minus an offset and this known maximum plus the offset, where the offset may allow a larger acceptable number of error bits to exist in the data prior to identifying the row of memory cells as requiring a refresh operation (e.g., a "Yes" result in operation S114)).

Checking for write disturb (S115) by the logic block 115 may be performed in the same or similar manner as described herein. In some examples, rather than counting a number of bit errors of data read from a row of memory cells (e.g., as determined by the error correction block 114 as described herein), the data may be read with different resistance reference values (e.g., first and second resistance values, and/or third and fourth resistance values, as described herein), and the resulting read data (multiple sets of read data respectively resulting from use of the different resistance reference values) may have the number of bits of the certain logic level counted. If the number of bits of the read data having the certain logic level deviates less from the predetermined range in correspondence to a larger difference of the corresponding resistance reference value used to read data with respect to the read reference value RR, it may be determined that the bit errors are determined by write disturb (as noted, the predetermined range may correspond to a known minimum and known maximum of the logic bits that would exist in error free data after performing bit equalization).

In this example, the refresh operation (S116) may be performed by the logic block 115 in the same manner as described herein, although the data may require later processing (if not performed already) by the error correction block 114 to identify which bits of the data are error bits that are to be corrected by the refresh operation.

In this example, identifying if a row of memory cells requires a refresh operation (e.g., a "Yes" result in operation S114) and determining whether bit errors arose from write disturb (S115) may be performed in a simple manner without requiring complex computations by the error correction block 114 to determine a number of bit errors and thus save power. In addition, determining if a row of memory cells requires a refresh operation (e.g., a "Yes" result in operation S114) and determining if errors arose from write disturb (S115) may be performed with simple circuitry which may be part of the nonvolatile memory device chip. For example, all or some of the logic block 115 circuitry may be part of each nonvolatile memory device chip. For example, each nonvolatile memory device chip may comprise a counter that counts the number of bits of a certain logic level (high or low) of data read from a row of memory cells read of a bank of the nonvolatile memory device (e.g., read data stored in a buffer (e.g., page buffer) of the nonvolatile memory device), comparators that compare the count of this counter to a first threshold and second threshold as describe herein, and registers that store the first threshold and second threshold. In some examples, the first threshold and the second threshold may be programmable, such as by programming a mode register set of the nonvolatile memory device via an external source, such as controller 110. When the nonvolatile memory device includes such circuitry to perform operations S114 and S115, data read as part of operations S114 and/or S115 need not be output from the nonvolatile memory device to an external source, such as to controller 110. If the nonvolatile memory device includes an on-chip error correction block 114 (e.g., as described herein), data read as part of operations S113 to S119 need not be output to an external source while error bits may be detected and corrected on-chip. Thus, operations S113 to S119, including performing any refresh operations (S116) may be automatically performed by a nonvolatile memory device (e.g., without receiving related commands from controller 110).

FIG. 14 is a diagram illustrating an example in which a check read operation is performed on memory cells MC. Referring to FIGS. 1 to 9 and 14, in operation S211, the write operation (e.g., set operation and/or the reset operation) may be performed on the memory cells MC of the fifth word line WL5. As described with reference to FIG. 12, as operation S211 is performed, a count CNT may reach a random number RN, and thus, a check condition may be satisfied.

When the check condition is satisfied, in operation S212, the check read operation may be performed on the memory cells MC of the sixth word line WL6 being a first neighbor word line of first order neighbor word lines. That the number of bit errors is less than the threshold may be detected in the check read operation associated with the memory cells MC of the sixth word line WL6. Accordingly, the check read operation associated with the memory cells MC of the sixth word line WL6 ends.

In operation S213, the check read operation may be performed on the memory cells MC of the fourth word line WL4 being a second neighbor word line of the first order neighbor word lines. That the number of bit errors reaches the threshold may be detected in the check read operation associated with the memory cells MC of the fourth word line WL4. Accordingly, whether errors arise from the write disturbance should be determined with regard to the memory cells MC of the fourth word line WL4.

FIG. 15 is a diagram illustrating an example of a check read operation which is performed following FIG. 14. Referring to FIGS. 1 to 9 and 15, in operation S214, the write disturbance is checked with regard to the memory cells MC of the fourth word line WL4. For example, the errors of the memory cells MC of the fourth word line WL4 may be determined as arising from the write disturbance. After the write disturbance is checked, in operation S215, the refresh operation may be performed on the memory cells MC of the fourth word line WL4, and thus, the reliability of data may be restored.

In operation S216, the check read operation may be performed on the memory cells MC of the second word line WL2 being a second order neighbor word line. For example, an i-th order neighbor word line (i being a positive integer greater than 1) may be a word line of a location having an influence of the write disturbance together with a (i-1)-th order neighbor word line.

For example, the memory cells MC of the fourth word line WL4 may experience the write disturbance together with the memory cells MC of the sixth word line WL6 when the set operation or the reset operation is performed on the memory cells MC of the fifth word line WL5. Also, the memory cells MC of the fourth word line WL4 may experience the write disturbance together with the memory cells MC of the second word line WL2 when the set operation or the reset operation is performed on the memory cells MC of the third word line WL3.

The check read operation associated with the sixth word line WL6 of the second word line WL2 and the sixth word line WL6 is already performed in operation S212. Accordingly, a second order check read operation may be performed on the memory cells MC of the second word line WL2.

In an embodiment, an i-th order neighbor word line may be (2i-1)-th placed away from a word line where the initial write operation (e.g., set operation or the reset operation) is performed. One word line may be interposed between an i-th order neighbor word line and an (i-1)-th order neighbor word line. The i-th order neighbor word line may neighbor on the (i-1)-th order neighbor word line, with one word line interposed therebetween.

Figure 16:
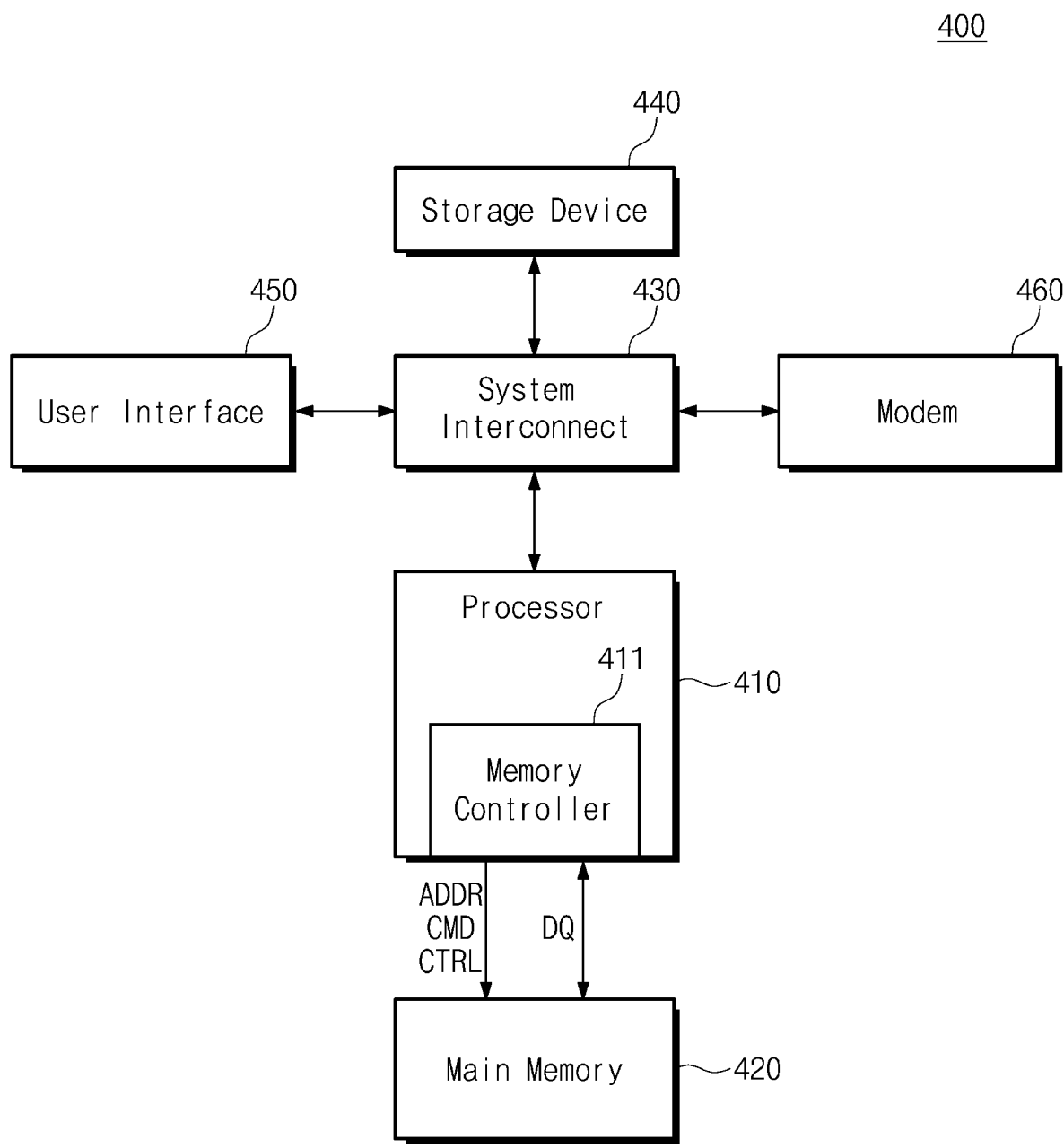
FIG. 16 is a block diagram illustrating a computing device according to an embodiment of the inventive concept.

FIG. 16 is a block diagram illustrating a computing device 400 according to an embodiment of the inventive concept. Referring to FIG. 16, the computing device 400 may be implemented with one of various computing devices such as a desktop computer, a notebook computer, a data server, an application server, a smartphone, and a smart tablet.

A processor 410 may be a central processing unit (CPU) or an application processor (AP) which performs various operations. The processor 410 may be implemented in such a way that the central processing unit (CPU) and the application processor (AP) are combined with a graphic processing unit (GPU) or a neural processing unit (NPU).

The processor 410 may include a memory controller 411. The processor 410 may access a main memory 420 by using the memory controller 411. The main memory 420 may perform access operations, such as read and write operations (e.g., the set operation, the reset operation) under control of the memory controller 411. The memory controller 411 may be memory controller 10 described elsewhere herein.

The main memory 420 may receive an address ADDR, a command CMD, and a control signal CTRL from the memory controller 411. The main memory 420 may exchange data signals DQ with the memory controller 411. The main memory 420 may comprise the memory module 100 described with reference to FIG. 1 and/or the nonvolatile memory device 200 described with reference to FIG. 3.

A system interconnect 430 may provide channels between components of the computing device 400. The system interconnect 430 may be implemented in compliance with one of various standards such as peripheral component interconnect express (PCIe) and advanced microcontroller bus architecture (AMBA).

A storage device 440 may function as a secondary memory of the computing device 400. The storage device 440 may have an access speed slower than the main memory 420 and may have a storage capacity larger than the main memory 420. The storage device 440 may include a hard disk drive (HDD), a solid state drive (SSD), a portable memory, etc.

A user interface 450 may exchange information with a user. The user interface 450 may include a user input interface, which receives information from the user, such as a keyboard, a mouse, a touch panel, or a microphone, and a user output interface, which provides information to the user, such as a monitor, a speaker, or a motor.

A modem 460 is configured to perform wired or wireless communication with an external device. The modem 460 may be configured to implement at least one of various standards such as long term evolution (LTE), Ethernet, wireless-fidelity (Wi-Fi), and Bluetooth. In an embodiment, the modem 460 may be included within the processor 410.

As described with reference to FIGS. 1 to 15, the main memory 420 may include phase change memory cells. The main memory 420 may perform the set operation or the reset operation on phase change memory cells for each row of memory cells (e.g., corresponding to those memory cells connected to a word line). When the check condition is satisfied after the set operation or the reset operation is performed, the main memory 420 may perform the check read operation as described herein.

For example, the main memory 420 may perform random interval neighbor check RINC. When the write disturbance is detected from a result of the check read operation, the main memory 420 may sequentially perform check read operations on i-th order neighbor word lines. Accordingly, the reliability of the main memory 420 and the computing device 400 is improved.

Also, when the end condition is satisfied even though the check read operation is required, the main memory 420 may stop (or skip) the check read operation. Accordingly, latency of the main memory 420 is prevented from increasing excessively due to the check read operation. The main memory 420 may provide trade-off between the reliability and the latency by adjusting the end condition dynamically or adaptively. For example, thresholds determining end condition analyses of step S118 may be adjusted, such as by analysis of memory usage, environment conditions (e.g., temperature and/or humidity) or by programming a mode register of the main memory 420 (by a host which may be in response to a user input by a user).

In an embodiment, the checker 112 may be included in the memory controller 411. The memory controller 411 may perform the set operation or the reset operation on phase change memory cells for each row of the main memory 420. When the check condition is satisfied after the set operation or the reset operation is performed, the memory controller 411 may perform the check read operation.

For example, the memory controller 411 may perform random interval neighbor check RINC. When the write disturbance is detected from a result of the check read operation, the memory controller 411 may sequentially perform check read operations on i-th order neighbor word lines. When the end condition is satisfied even though the check read operation is required, the memory controller 411 may stop (or skip) the check read operation.

As described above, components or operations of the embodiments, such as memory module 100 and the nonvolatile memory device 200, are above described by using the ordinal numbers, such as "first", "second", "third", and the like. It should be appreciated that such ordinal numbers may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

In the above embodiments, circuits of the embodiments of the inventive concept are described in terms of blocks (and/or represented as blocks in the figures, such as checker 112). It will be appreciated that these blocks may be implemented by a variety of hardware devices, such as an integrated circuit, an application specific IC (ASCI), a field programmable gate array (FPGA), and a complex programmable logic device (CPLD), firmware driven in hardware devices, and/or general purpose controllers configured by software such as an application, or a combination of a hardware device and software. Also, the blocks may include circuits or intellectual property (IP) implemented with semiconductor elements in an integrated circuit.

According to the inventive concept, a check read operation for checking disturbance is performed sequentially on neighbor memory cells of accessed memory cells. When the disturbance is detected, a follow-up operation to address and correct the disturbance may be performed. Accordingly, a semiconductor memory device which includes a phase change memory device checking and solving the disturbance and a method of accessing the phase change memory device are provided. However, it is again emphasized that the description of the nonvolatile memory of the embodiments as phase change memory should not imply that the invention is limited to use with phase change memory and other nonvolatile memories may have write disturbance bit errors detected and corrected in accordance with the novel aspects of the invention.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
   a memory cell array comprising a plurality of memory cells arranged in a plurality of rows of memory cells, each memory cell comprising a variable resistor including a material having a changeable resistance;
   a plurality of word lines, each word line connected to a corresponding row of memory cells;
   a control logic circuit configured to write data to the memory cell array and read data from the memory cell array; and
   a checker circuit being configured, in response to a write operation to a first row of memory cells, to cause a check read operation of a second row of memory cells immediately adjacent to the first row of memory cells to determine if a programmed state of the second row of memory cells is indicative of a write disturbance to the programmed state of the second row of memory cells.

2. The memory device of claim 1,
wherein the checker circuit is configured, in response to determining that the programmed state of the second row of memory cells is indicative of a write disturbance, to perform a check read operation of a fourth row of memory cells to determine if a programmed state of the fourth row of memory cells is indicative of a write disturbance of the programmed state of the fourth row of memory cells,
wherein a third row of memory cells is interposed between and immediately adjacent to both of the second row of memory cells and the fourth row of memory cells.

3. The memory device of claim 2, wherein checker circuit is configured to identify a first block of rows of memory cells to be refreshed and to cause a refresh operation of each of the rows of memory cells of the first block of rows of memory cells.

4. The memory device of claim 3, wherein the checker circuit is configured to cause a refresh operation with bit error corrected data of data of each of the rows of memory cells of the first block of memory cells.

5. The memory device of claim 1,
wherein the checker circuit is configured to obtain a first count of the number of logic high bits or of the number of logic low bits of the second row of memory cells, and
wherein the checker circuit is configured to determine if the programmed state of the second row of memory cells is indicative of a write disturbance by comparing the first count to a predetermined value.

6. The memory device of claim 1, wherein the check read operation of the checker circuit comprises a first read operation and a second read operation of the same bits of data stored by the second row of memory cells, the first read operation and second read operation respectively using a first resistance value and a second resistance value, the first and second resistance values being different from each other.

7. The memory device of claim 6, wherein the first and second resistance values are provided as a first voltage and a second voltage, respectively.

8. The memory device of claim 1, wherein the memory device is a phase change memory (PCM) semiconductor chip and the memory cell array, the plurality of word lines, the control logic circuit and the checker circuit are formed on the phase change memory (PCM) semiconductor chip.

9. The memory device of claim 1, wherein the checker circuit is configured to perform a random interval neighbor check (RINC).

10. The memory device of claim 9,
wherein the checker circuit is configured to track a number of sequential write operations performed on a portion of the memory cell array, and
wherein the checker circuit is configured to identify the first row of memory cells as the row of memory cells associated with the nth sequential write operation of the sequential write operations performed on the portion of the memory cell array, where n is a randomly generated integer.

11. The memory device of claim 1,
wherein the memory cell array comprises n banks, where n is an integer equal to or greater than 2,
wherein the checker circuit comprises:

n counters each configured to provide a count of a number of sequential write operations performed by a corresponding bank,
n registers each configured to store a random number, and
n comparators each configured to compare the random number stored by a corresponding one of the n registers with the count provided by a corresponding one of the n counters and to output an enable signal when the random number stored by the corresponding one of the n registers equals the count provided by the corresponding one of the n counters.

12. The memory device of claim 11, wherein the checker circuit is responsive to the output of an enable signal from one of the n comparators to cause the check read operation of the second row of memory cells immediately adjacent to the first row of memory cells.

13. The memory device of claim 11, further comprising a random number generator configured to generate and provide a corresponding random number to each of the registers.

14. The memory device of claim 13,
wherein the random number generator is responsive to the output of a first enable signal from a first comparator of the n comparators to provide a new random number to a first register of the n registers, and
wherein the first comparator is connected to the first register and a first counter of the n counters.

15. The memory device of claim 1, wherein the checker circuit is configured to enter a check read mode, the checker circuit in the check read mode being configured to perform a plurality of check read operations on corresponding rows of memory cells,
wherein the initial check read operation of the plurality of check read operations is the check read operation of the second row of memory cells,
wherein each remaining check read operation of the plurality of check read operations after the initial check read operation is performed in response to the checker circuit determining that the immediately previous check read operation of the corresponding row of memory cells indicates that a programmed state of the corresponding row of memory cells has been subject to a write disturbance.

16. The memory device of claim 15, wherein, in the check read mode of the checker circuit, the checker circuit in configured to sequentially select every other row of memory cells of a first group of rows of memory cells of the memory cell array as at least some of the plurality of rows of memory cells subject to the plurality of check read operations, the first group of rows of memory cells being located at a first side of the first row of memory cells.

17. The memory device of claim 16, wherein, in the check read mode of the checker circuit, the checker circuit in configured to sequentially select every other row of memory cells of a second group of rows of memory cells of the memory cell array as at least some of the plurality of rows of memory cells subject to the plurality of check read operations, the second group of rows of memory cells being located at a second side of the first row of memory cells that is opposite to the first side of the first row of memory cells.

18. The memory device of claim 15, wherein, in the check read mode, the checker circuit is configured to identify rows of memory cells to be subject to a refresh operation.

19. The memory device of claim 18, wherein, for each of the rows of memory cells identified by the checker circuit to be subject to a refresh operation, the checker circuit is configured to perform a refresh operation by reading the data from the corresponding identified row of memory cells, subjecting the read data to error correction to obtain error corrected data and writing the error corrected data to the corresponding identified row of memory cells.

20. The memory device of claim 18,
wherein the memory device is a phase change memory (PCM) semiconductor chip and the memory cell array, the plurality of word lines, the control logic circuit and the checker circuit are formed on the phase change memory (PCM) semiconductor chip,
wherein the checker circuit is configured to perform refresh operations of the rows of memory cells identified to be subject to a refresh operation during an idle time of the PCM semiconductor chip.

21. The memory device of claim 1, further comprising an error correction code circuit configured to determine bit errors in data read from the memory cell array,
wherein the checker circuit is configured to determine if a programmed state of the second row of memory cells is indicative of write disturbance by determining if a number of bit errors of the second row of memory cells provided by the error correction code circuit is greater or equal to a predetermined value.

22. The memory device of claim 1,
wherein the control logic circuit is configured to write data to the memory cell array by performing a set operation to achieve a first resistance state of some memory cells of the first row of memory cells and a reset operation to achieve a second resistance state that is different from the first resistance state to other memory cells of the first row of memory cells.

23. The memory device of claim 1, comprising a controller semiconductor chip, a first phase change memory (PCM) semiconductor chip and a bus providing communication between the controller semiconductor chip and the first phase change memory (PCM) semiconductor chip,
wherein the memory cell array, the plurality of word lines and the control logic circuit are formed as integrated circuits of the first phase change memory (PCM) semiconductor chip and the checker circuit is formed as an integrated circuit of the controller semiconductor chip.

24. The memory device of claim 23, comprising a plurality of second phase change memory (PCM) semiconductor chips each in communication with the controller semiconductor chip,
wherein, for each of the second PCM semiconductor chips, the checker circuit is configured to perform a check read operation and to determine if the check read operation indicates a write disturbance.

* * * * *